(12) United States Patent
Morrow et al.

(10) Patent No.: US 12,557,259 B2
(45) Date of Patent: Feb. 17, 2026

(54) BACKSIDE SHUNT CONTACT FOR IMPROVED INTEGRATED CIRCUIT LAYOUT

(71) Applicant: Intel Corporation, Santa Clara, CA (US)

(72) Inventors: Patrick Morrow, Portland, OR (US); Seenivasan Subramaniam, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 922 days.

(21) Appl. No.: 17/546,770

(22) Filed: Dec. 9, 2021

(65) Prior Publication Data
US 2023/0189495 A1  Jun. 15, 2023

(51) Int. Cl.
*H10B 10/00* (2023.01)
(52) U.S. Cl.
CPC ................... *H10B 10/125* (2023.02)
(58) Field of Classification Search
CPC ............ H10B 10/125; H10D 30/6211; H10D 30/024; H10D 30/6212; H10D 84/853; H10D 84/0193
See application file for complete search history.

(56) References Cited

U.S. PATENT DOCUMENTS

| 2016/0197069 A1* | 7/2016 | Morrow | H01L 23/5386 |
| | | | 257/393 |
| 2018/0315762 A1 | 11/2018 | Kim et al. | |
| 2020/0294998 A1 | 9/2020 | Lilak et al. | |
| 2021/0175124 A1* | 6/2021 | Rao | H01L 21/30625 |
| 2021/0202696 A1 | 7/2021 | Guha et al. | |
| 2021/0366916 A1* | 11/2021 | Ye | H10D 84/853 |
| 2022/0181453 A1* | 6/2022 | Liebmann | H10D 30/6757 |
| 2022/0271122 A1* | 8/2022 | Chuang | H10D 84/85 |

OTHER PUBLICATIONS

Extended European Search Report received for EP Application No. 22205676.4 dated May 9, 2023. 9 pages.

* cited by examiner

*Primary Examiner* — Yara B Green
*Assistant Examiner* — Seth D Lawson
(74) *Attorney, Agent, or Firm* — Arcane Law PLLC

(57) ABSTRACT

Techniques are provided herein to form semiconductor devices having conductive backside structures to couple various transistor structures. In some embodiments, a given conductive backside structure acts as a shunt interconnect between two transistors, such as between the gate of one transistor and the source or drain region of another transistor. In an example, an integrated circuit includes two transistor devices having semiconductor material extending between separate source and drain regions and different gate structures over or around the semiconductor material of the two transistor devices. A conductive backside structure may be formed from the backside of the integrated circuit (e.g., after removing all or most of the substrate), where the backside structure contacts the source or drain region of one transistor and the gate structure of the other transistor.

20 Claims, 18 Drawing Sheets

BACKSIDE SHUNT CONTACT FOR IMPROVED INTEGRATED CIRCUIT LAYOUT

FIELD OF THE DISCLOSURE

The present disclosure relates to integrated circuits, and more particularly, to backside contacts.

BACKGROUND

As integrated circuits continue to scale downward in size, a number of challenges arise. For instance, reducing the size of memory and logic cells or otherwise increasing transistor device density is becoming increasingly more difficult. In many layouts, such as for an static random access memory (SRAM) bit cell or a complementary metal oxide semiconductor (CMOS) cell, certain transistor structures are conductively coupled to other transistor structures. This coupling can be performed using a metal 0 or metal 1 layer above the transistors. However, using such metal layers for these contacts causes congestion among the metal interconnects and leads to an overall increase in the device footprint. Accordingly, there remain a number of non-trivial challenges with respect to coupling between various transistor structures.

Figure 1A:
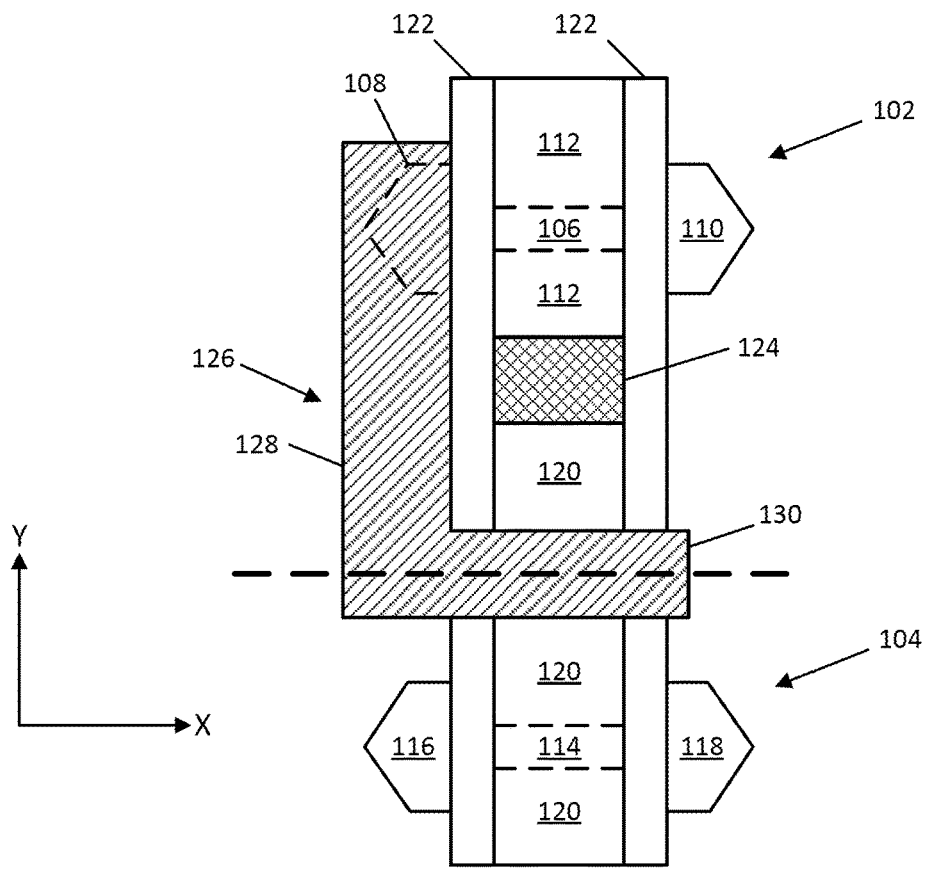
FIG. 1A is a plan view of a portion of an integrated circuit from the backside of the circuit illustrating how transistor structures from two different transistors are coupled together using a conductive backside structure, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having conductive backside structures to couple various transistor structures. The techniques can be used in any number of integrated circuit applications and are particularly useful with respect to logic and memory cells, such as those cells that use finFETs or gate-all-around (GAA) transistors. In some embodiments, a given conductive backside structure acts as a shunt interconnect between two transistors, such as between the gate of one transistor and the source or drain region of another transistor. Implementing such connectors from the backside of the device provides more space for forming front-side interconnects and can allow for more compact circuit layouts. In an example, an integrated circuit includes two transistor devices having semiconductor material extending between separate source and drain regions and different gate structures over or around the semiconductor material of the two transistor devices. A conductive backside structure may be formed from the backside of the integrated circuit (e.g., after removing all or most of the substrate), where the backside structure contacts the source or drain region of one transistor and the gate structure of the other transistor. Numerous variations and embodiments will be apparent in light of this disclosure.

General Overview

As previously noted above, there remain a number of non-trivial challenges with respect to layout scaling and interconnect design. In more detail, using metal 0 and/or metal 1 layers above semiconductor devices to form lateral interconnections between different transistor structures uses up valuable space within those interconnect levels and makes routing other interconnects on those levels more challenging. As a result, the scaling for layouts that use such lateral interconnection contacts, such as an SRAM bit cell, are limited due to the presence of the lateral interconnections on the interconnect levels.

Thus, and in accordance with an embodiment of the present disclosure, techniques are provided herein to form a conductive backside structure that can act as a shunt contact between structures of two or more different transistors. For example, in some layouts, a connection is made between a source or drain region of one transistor and a gate of another transistor. Such shunt interconnects may be formed on the backside of the circuit to free up more space among the front-side interconnect levels. In an example, the conductive backside structure may be formed in two stages. A first stage may involve the formation of a strip of conductive material along the side of a spacer structure that contacts the source or drain region (sometimes more simply called a diffusion region) of a first transistor. A second stage may involve the formation of another conductive layer that crosses the strip of conductive material and also contacts the gate of a second transistor. In some such embodiments, the first and second transistors include semiconductor material that extend parallel to one another between source and drain regions. The semiconductor material may include one or more suspended nanoribbons. By using the backside contacts, semiconductor layouts can be made more compact. In one particular example, an SRAM bit cell can use a stacked transistor design (where different transistors are formed over one another in a vertical direction) and the conductive backside structures to reduce the cell footprint by up to 50%.

According to an embodiment, an integrated circuit includes a first semiconductor device having a first semiconductor material extending between a first source region and a first drain region, and a second semiconductor device having a second semiconductor material extending between a second source region and a second drain region. The integrated circuit further includes a first gate structure over the first semiconductor material, a second gate structure over the second semiconductor material, and a conductive backside structure that contacts the first source region or the first drain region of the first semiconductor device from underneath the first source region or the first drain region and contacts the second gate structure from underneath the second gate structure. In an example, the first and second transistors are part of a multi-transistor memory cell. In one such example, consider an SRAM cell that includes six transistors where the gate of one transistor is connected to the source or drain of another transistor. Note there may be multiple such connections is a given cell.

According to another embodiment, a method of forming an integrated circuit includes forming a first fin having first semiconductor material on a semiconductor substrate and a second fin having second semiconductor material on the semiconductor substrate; forming a dielectric layer at least between the first fin and the second fin and on the semiconductor substrate; forming a sacrificial gate layer over at least the first fin; forming a spacer structure on a sidewall of the sacrificial gate layer; etching a first trench through a portion of the dielectric layer and adjacent to the spacer structure; forming a sacrificial layer in the first trench; forming a source or drain region coupled to the first semiconductor material and over the sacrificial layer; forming a gate structure having a gate electrode and a gate dielectric over at least the second semiconductor material; removing the substrate; removing the sacrificial layer from the first trench and forming a first conductive layer in the first trench; etching a second trench through a portion of the dielectric layer between the first conductive layer and the gate structure; and forming a second conductive layer in the second trench.

The techniques can be used with any type of non-planar transistors, including finFETs (sometimes called double-gate transistors, or tri-gate transistors), or nanowire and nanoribbon or nanosheet transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a conductive backside structure that extends from the source or drain region of one transistor to a gate of another transistor. The conductive backside structure may run along a trench between adjacent semiconductor devices and/or along a spacer structure to contact the source or drain region. The conductive backside structure may also include an arm or protrusion that contacts the gate of the other transistor. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

Figure 1B:
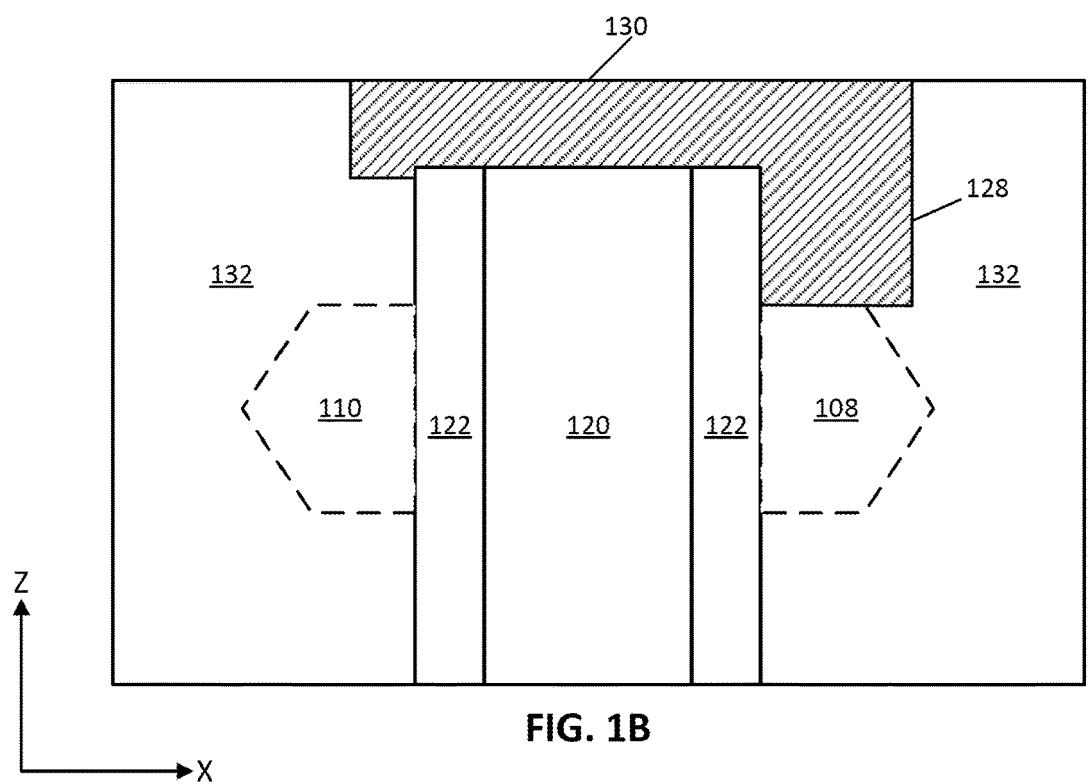
FIG. 1B is a cross-section view of the portion of the integrated circuit from FIG. 1A taken through the dashed line in FIG. 1A, in accordance with an embodiment of the present disclosure.

FIG. 1A is a plan view of a portion of an integrated circuit that includes a first semiconductor device 102 and a second semiconductor device 104, in accordance with an embodiment of the present disclosure. FIG. 1B is a cross-section view taken across the thick dashed line in FIG. 1A. Semiconductor devices 102 and 104 may be non-planar metal oxide semiconductor (MOS) transistors, such as tri-gate or gate-all-around transistors (e.g., nanoribbon or forksheet devices), although other transistor topologies and types could also benefit from the techniques provided herein.

First semiconductor device 102 includes a first semiconductor material 106 that extends between a first source region 108 and a first drain region 110, and a first gate structure 112 around first semiconductor material 106. Any source region may also act as a drain region and vice versa, depending on the application. In some embodiments, first semiconductor material 106 includes a fin of semiconductor material formed from a semiconductor substrate. In this example, the semiconductor substrate has been removed due to backside processing. Alternatively, the semiconductor fin can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fin includes alternating layers of material (e.g., alternating layers of silicon and SiGe) that facilitates forming of nanowires or nanoribbons or nanosheets during a gate forming process where one type of the alternating layers are selectively etched away so as to release the other type of alternating layers within the channel region, so that a gate-all-around (GAA) process can then be carried out. Again, the alternating layers can be blanket deposited and then etched into fins or deposited into fin-shaped trenches. Such nanowires or nanoribbons or nanosheets extend in a suspended fashion between first source or drain region 108 and second source or drain region 110.

According to some embodiments, source region 108 and drain region 110 are epitaxial source or drain regions that are provided on semiconductor material 106 in an etch-and-replace process. In other embodiments one or both of source region 108 and drain region 110 could be, for example, implantation-doped native portions of semiconductor material 106. Any semiconductor materials suitable for source and drain regions can be used (e.g., group IV and group III-V semiconductor materials). Source region 108 and drain region 110 may include multiple layers such as liners and capping layers to improve contact resistance. In any such cases, the composition and doping of source region 108 and drain region 110 can be selected based on the desired polarity of the transistor (e.g., phosphorus-doped silicon for n-type diffusion regions, and boron-doped silicon or silicon germanium for p-type diffusion regions). Any number of source and drain configurations and materials can be used.

A first gate structure 112 may include both a gate dielectric layer and a gate electrode over the gate dielectric. The gate dielectric may include a single material layer or multiple material layers. In some embodiments, the gate dielectric includes a first dielectric layer such as an oxide native to first semiconductor material 106 (e.g., silicon oxide) and a second dielectric layer that includes a high-k material (e.g., such as hafnium oxide). The high-k material may be doped with an element to affect the threshold voltage of the given semiconductor device. In other embodiments, the gate dielectric only includes high-k dielectric material; in still other embodiments, the gate dielectric only includes regular-k dielectric material (e.g., silicon oxide).

According to some embodiments, the gate electrode extends over the gate dielectric around first semiconductor material 106. The gate electrode may include any sufficiently conductive material such as a metal, metal alloy, or doped polysilicon. In some embodiments, the gate electrode includes different conductive layers, such as one or more workfunction metals and a fill metal. In some embodiments, semiconductor device 102 is a p-channel device that includes n-type dopants within first semiconductor material 106 and includes a workfunction metal having titanium around first semiconductor material 106. In some embodiments, semiconductor device 102 is an n-channel device that includes p-type dopants within first semiconductor material 106 and includes a workfunction metal having tungsten around semiconductor material 106. The fill metal or other conductive material may be used around the one or more workfunction metals to provide the whole gate electrode structure.

All of the description above for first semiconductor device 102 is equally applicable to second semiconductor device 104. Accordingly, second semiconductor device 104 includes a second semiconductor material 114 that extends between a second source region 116 and a second drain region 118, and a second gate structure 120 around second semiconductor material 114. Any number of semiconductor devices may be provided, although only two are illustrated here for clarity.

Spacer structures 122 are included that run along either side of first gate structure 112 and second gate structure 120. Spacer structures 122 may include a dielectric material, such as silicon nitride, silicon oxynitride, or silicon oxycarbonitride. According to some embodiments, spacer structures 122 also wrap around the ends of both first semiconductor material 106 and second semiconductor material 114, such that first semiconductor material 106 and second semiconductor material 114 extend through spacer structures 122 to contact the corresponding source and drain regions. A gate cut 124 may be provided within spacer structures 122 and separating first gate structure 112 from second gate structure 120. Accordingly, gate cut 124 may be any suitable insulating material, such as silicon nitride, silicon oxynitride, or silicon oxycarbonitride.

According to some embodiments, a conductive backside structure 126 is used as a shunt contact between source region 108 (which may also act as a drain region) of first semiconductor device 102 and second gate structure 120 of second semiconductor device 104. The plan view in FIG. 1A is taken from the backside of the structure to illustrate how conductive backside structure 126 includes a first conductive layer 128 that extends lengthwise in a first direction (e.g., along the Y direction) to contact source region 108 and a second conductive layer 130 that intersects first conductive layer 128 and also contacts second gate structure 120. In some examples, second conductive layer 130 extends in a second direction (e.g., along the X direction) that is orthogonal to the first direction of first conductive layer 128. Since the plan view of FIG. 1A is a backside view, source region 108 is illustrated with dashed lines as it would be underneath first conductive layer 128. Any suitable conductive material, such as any metal, may be used for conductive backside structure 126. Some example materials include tungsten, copper, aluminum, ruthenium, titanium, or any alloys thereof.

The cross-section view of FIG. 1B illustrates how first conductive layer 128 extends down a portion of spacer structure 122, according to some embodiments. Additionally, second conductive layer 130 contacts the underside of both second gate structure 120 and spacer structures 122. It should be noted that "underside" as used here is considered to be relative to the location of the original substrate, which was removed to form conductive backside structure 126, as described in more detail with reference to the fabrication process illustrated in FIGS. 2-11. As can further be seen, the remaining space around semiconductor devices 102 and 104 is occupied by a dielectric fill 132 that may include any number of various dielectric layers. In some examples, a portion of dielectric fill 132 provides shallow trench isolation (STI) between adjacent semiconductor devices. Dielectric fill 132 can be any suitable dielectric material, such as silicon dioxide, aluminum oxide, or silicon oxycarbonitride.

It should be noted that the illustrated example with two semiconductor devices that have aligned gate structures (e.g., arranged between the same spacer structures 122 along the Y direction) is not the only architecture that can benefit from conductive backside structure 126. In some other example embodiments, for instance, second semiconductor device 104 is offset from first semiconductor device 102 in the X direction.

Fabrication Methodology

FIGS. 2A-11A and 2B-11B are plan and cross-sectional views, respectively, that collectively illustrate an example process for forming an integrated circuit configured with a conductive backside structure, in accordance with an embodiment of the present disclosure. FIGS. 2A-11A represent plan views of two semiconductor devices, while FIGS. 2B-11B represent corresponding cross-sectional views taken across the thick dashed line in each of FIGS. 2A-11A. Each figure shows an example structure that results from the process flow up to that point in time, so the depicted structure evolves as the process flow continues, culminating in the structure shown in FIGS. 11A and 11B, which is similar to the structures shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2B:
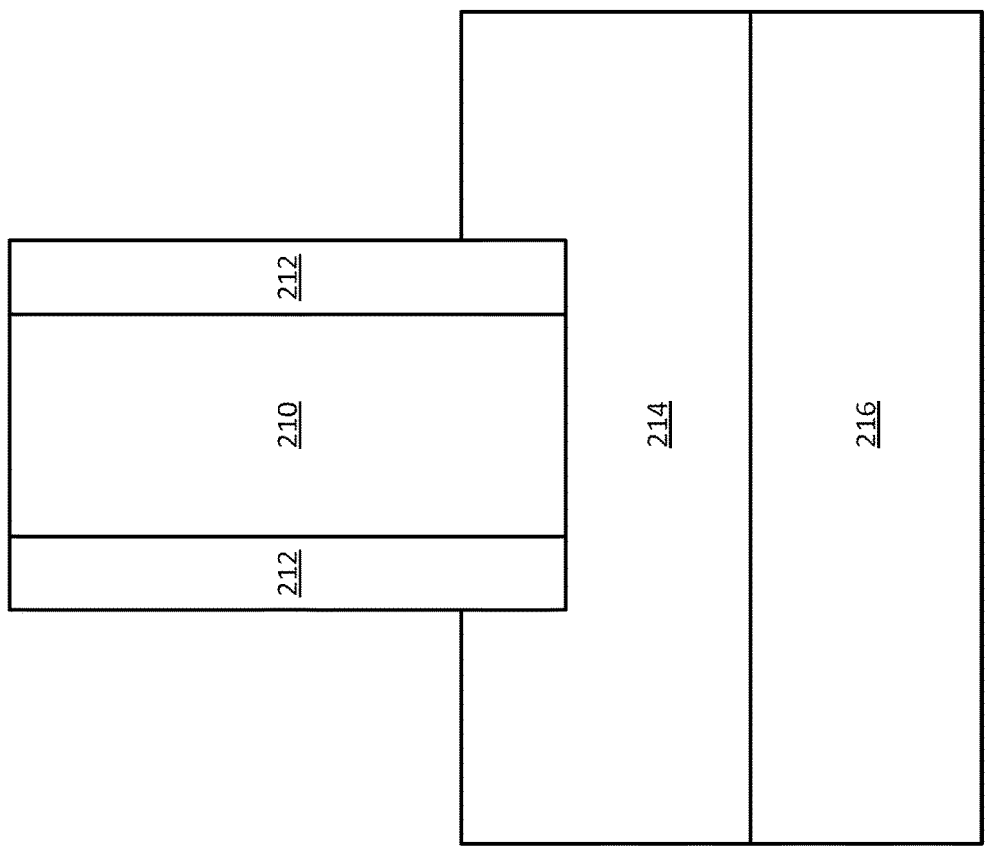
FIGS. 2A and 2B are plan and cross-sectional views, respectively, of a stage in an examples process for forming an integrated circuit configured with a conductive backside structure, in accordance with an embodiment of the present disclosure.
Figure 2A:
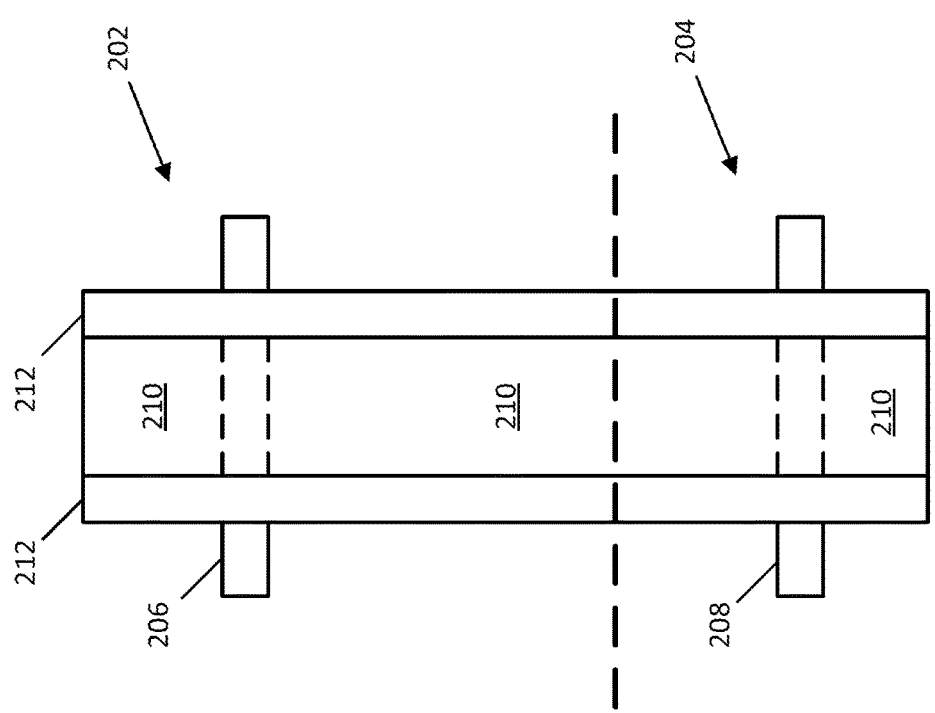

FIGS. 2A and 2B illustrate respective plan and cross-sectional views of a portion of an integrated circuit that includes a first semiconductor device 202 and a second semiconductor device 204, according to an embodiment. First semiconductor device 202 includes a first fin 206 of semiconductor material while second semiconductor device 204 includes a second fin 208 of semiconductor material. Each of first fin 206 and second fin 208 may include alternating layers of material in order to ultimately form nanowires or nanoribbons in a gate-all-around (GAA) structure. The alternating material layers that will ultimately form the nanowires or nanoribbons may include silicon, germanium, or both. In other examples, first fin 206 and second fin 208 include a single semiconductor material (e.g., silicon or germanium).

A sacrificial gate 210 crosses over each of first fin 206 and second fin 208 in a direction that is substantially orthogonal to the lengths of each of first fin 206 and second fin 208. Sacrificial gate 210 may include any material that can be safely removed later in the process without etching or otherwise damaging any portions of the fins or of spacer structures 212. In some embodiments, sacrificial gate 210 includes polysilicon. Spacer structures 212 may be formed along the long sidewalls of sacrificial gate 210 using an etch-back process where spacer material is deposited everywhere and then anisotropically etched to leave the material only on sidewalls of structures including on sacrificial gate 210. Spacer structures 212 may include a dielectric material, such as silicon nitride, silicon oxy-nitride, or any formulation of those layers incorporating carbon or boron dopants.

The cross-section view of FIG. 2B illustrates a dielectric layer 214 beneath, and on either side of, sacrificial gate 210 and spacer structures 212. Dielectric layer 214 may act as STI between adjacent semiconductor devices and can be any suitable dielectric material, such as silicon dioxide, aluminum oxide, or silicon oxycarbonitride. In some embodiments, dielectric layer 214 represents more than one deposited layer of dielectric material.

The various layers and structures are formed over a substrate 216. Substrate 216 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 216 can be a semiconductor-on-insulator substrate having a desired semiconductor layer over a buried insulator layer (e.g., silicon over silicon dioxide). Alternatively, substrate 216 can be a multilayer substrate or superlattice suitable for forming nanowires or nanoribbons (e.g., alternating layers of silicon and SiGe, or alternating layers indium gallium arsenide and indium phosphide). Any number of substrates can be used.

While dimensions can vary from one example embodiment to the next, in one example case, the total height of each of first fin 206 and second fin 208 (e.g., extending above the top surface of dielectric layer 214) may be between 50 nm and 150 nm, and the width of each of first fin 206 and second fin 208 can be, for example, in the range of 5 to 100 nm.

Figure 3B:
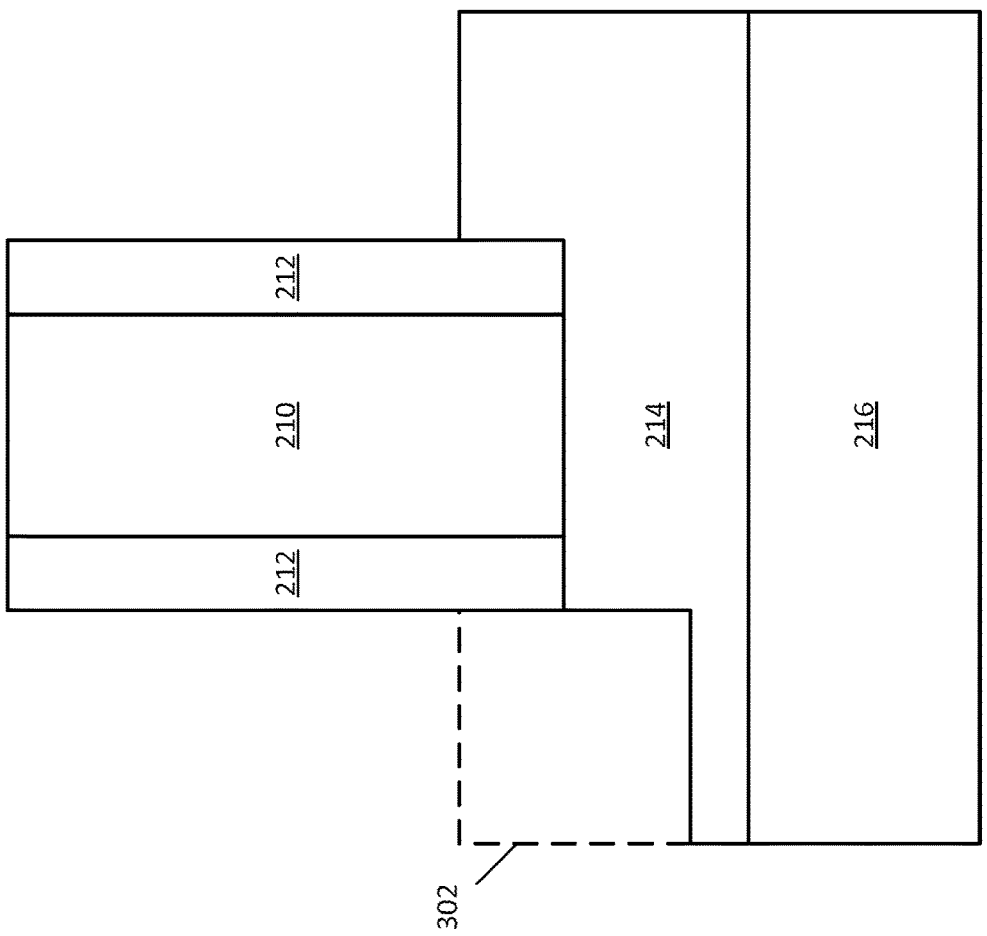
FIGS. 3A and 3B are plan and cross-sectional views, respectively, that illustrate another stage in the example process for forming the integrated circuit configured with a conductive backside structure, in accordance with an embodiment of the present disclosure.
Figure 3A:
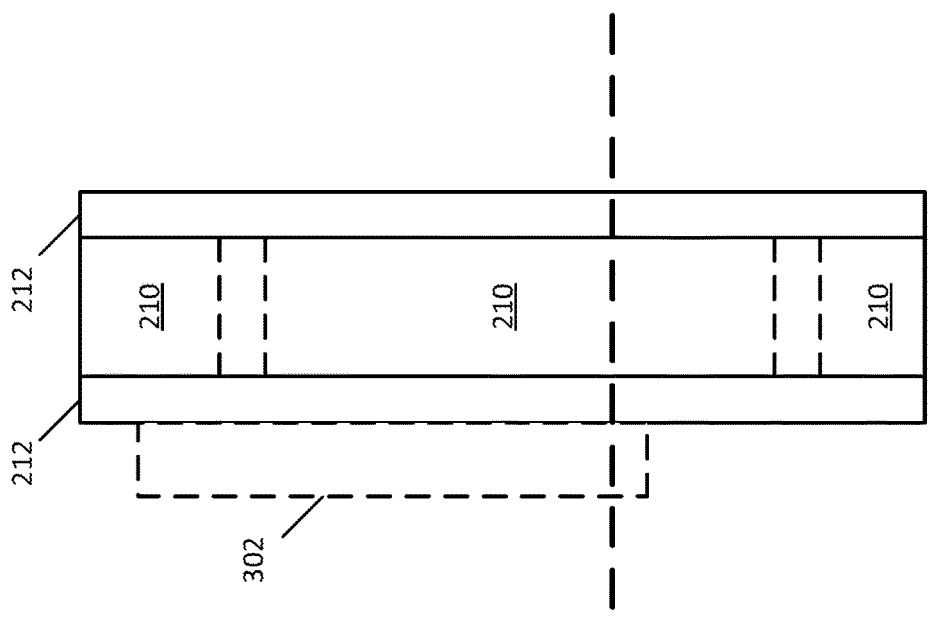

FIGS. 3A and 3B depict respective plan and cross-section views of the structure shown in FIGS. 2A and 2B following the removal of a portion of dielectric layer 214, according to an embodiment. According to some such embodiments, portions of first fin 206 and second fin 208 that are not protected under sacrificial gate 210 and spacer structures 212 are removed using any standard etching process. Afterwards, an anisotropic etch using, for example, reactive ion etching (RIE) may be used to form a trench 302 within dielectric layer 214. In some embodiments, the same RIE process used to remove the exposed portions of first fin 206 and second fin 208 is also used to form trench 302. According to some embodiments, trench 302 runs along an outside wall of a spacer structure 212, extending to an area where a portion of first fin 206 used to exist. According to some embodiments, a depth of trench 302 is between about 20 nm and about 100 nm, such as around 50 nm.

Figure 4B:
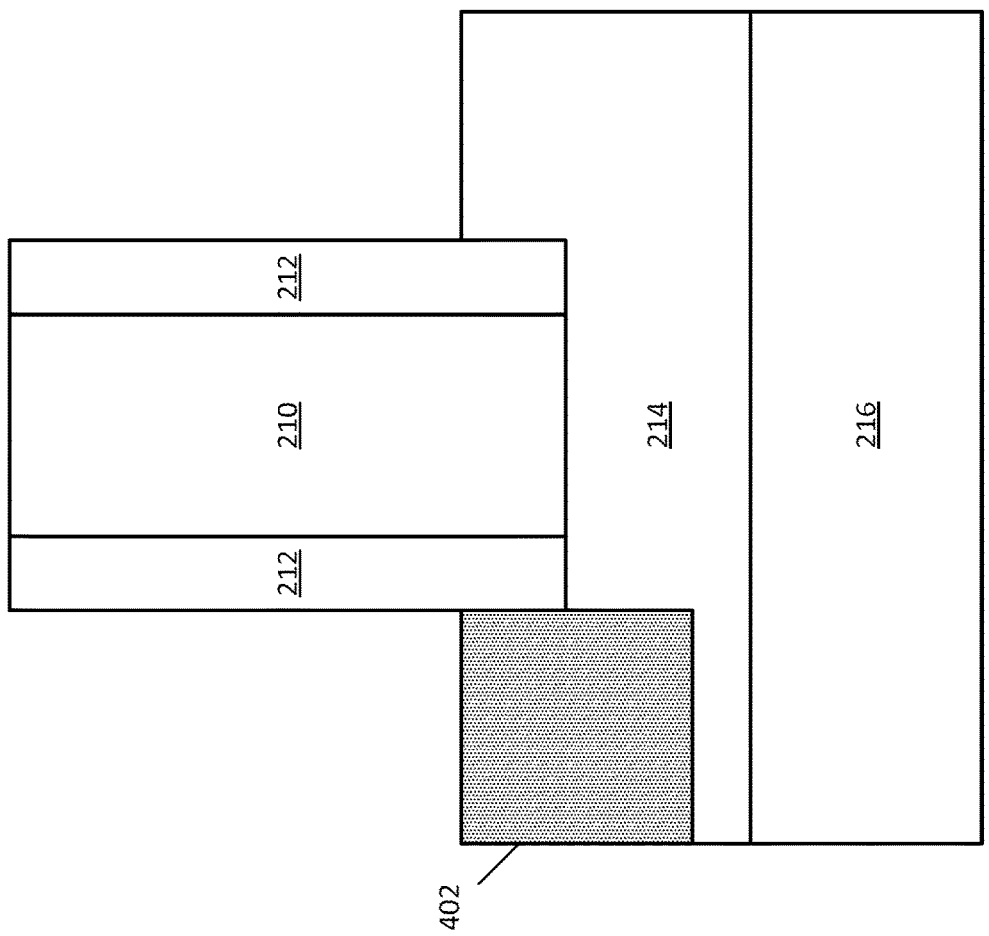
FIGS. 4A and 4B are plan and cross-sectional views, respectively, that illustrate another stage in the example process for forming the integrated circuit configured with a conductive backside structure, in accordance with an embodiment of the present disclosure.
Figure 4A:
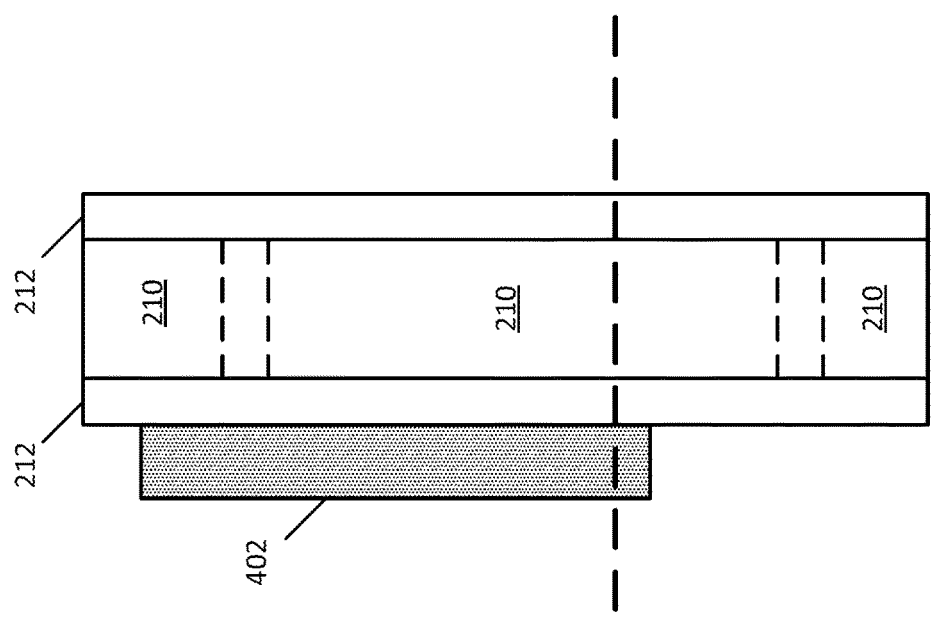

FIGS. 4A and 4B depict respective plan and cross-section views of the structure shown in FIGS. 3A and 3B following the formation of a sacrificial layer 402 within trench 302, according to an embodiment. According to some such embodiments, sacrificial layer 402 includes any material that can withstand high-temperature semiconductor processes, such as temperatures between 500 C and 800 C. Furthermore, sacrificial layer 402 should have high etch selectivity with the material of dielectric layer 214. In one example, sacrificial layer 402 includes titanium and nitrogen.

Figure 5B:
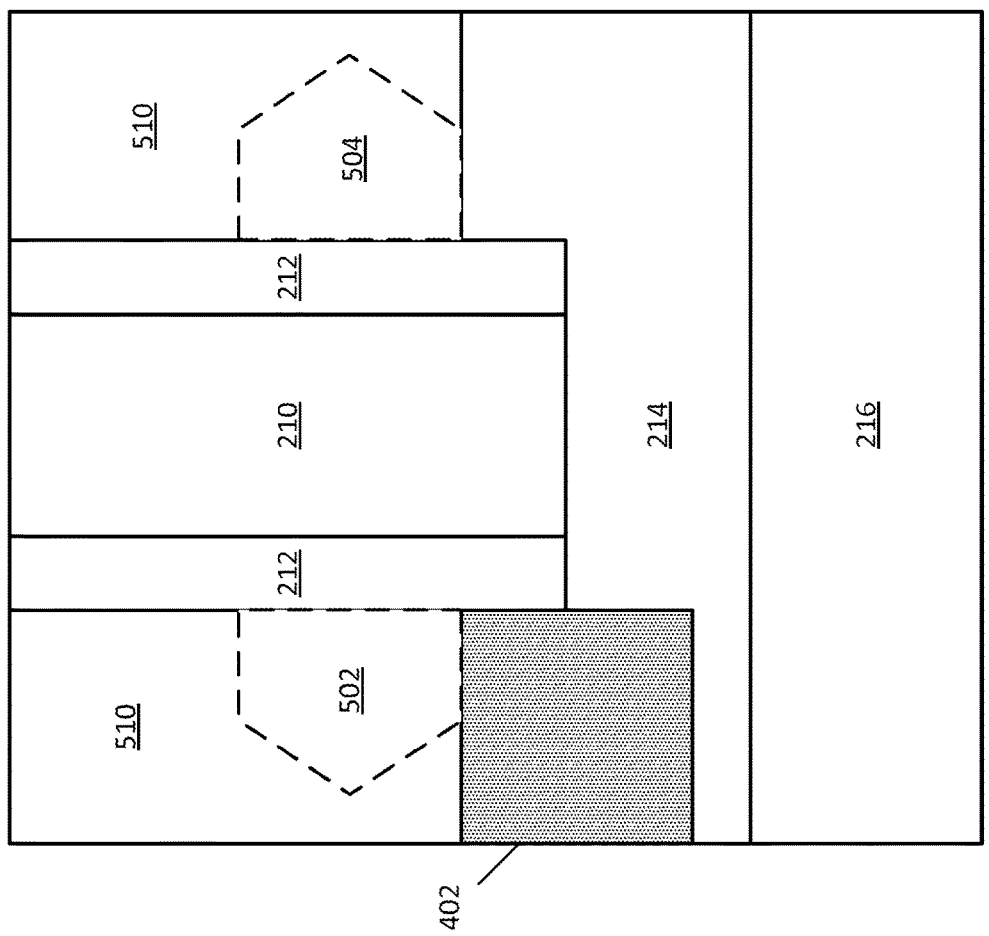
FIGS. 5A and 5B are plan and cross-sectional views, respectively, that illustrate another stage in the example process for forming the integrated circuit configured with a conductive backside structure, in accordance with an embodiment of the present disclosure.
Figure 5A:
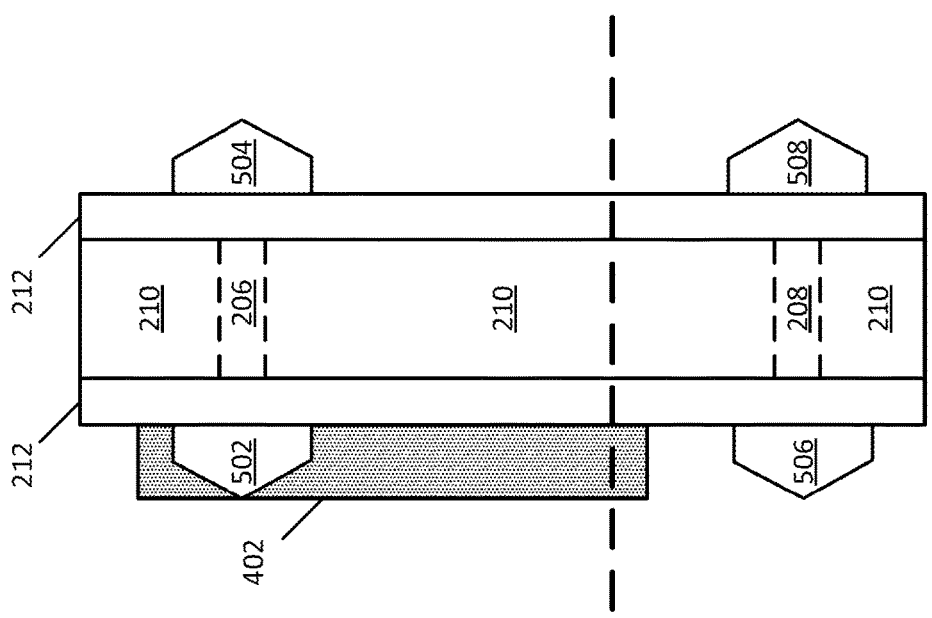

FIGS. 5A and 5B depict respective plan and cross-section views of the structure shown in FIGS. 4A and 4B following the formation of source and drain regions, according to an embodiment. According to some such embodiments, a first source region 502 and a first drain region 504 are formed at either ends of fin 206 while a second source region 506 and a second drain region 508 are formed at either ends of fin 208. In some examples, each of the source and drain regions are epitaxially grown from the exposed semiconductor material at both ends of fin 206 and fin 208. As noted above, either of first source region 502 and second source region 506 can act as a drain and similarly either of first drain region 504 and second drain region 508 can act as a source. Any semiconductor materials suitable for the source and drain regions can be used (e.g., group IV and group III-V semiconductor materials). Each of the source and drain regions may include multiple layers such as liners and capping layers to improve contact resistance. In any such cases, the composition and doping of first source and drain regions 502/504 and second source and drain regions 506/508 may be the same or different, depending on the polarity of two semiconductor devices. Any number of source and drain configurations and materials can be used. Note that source region 502 is formed directly over sacrificial layer 402 such that sacrificial layer 402 contacts source region 502.

According to some embodiments, a dielectric fill 510 is formed over the source and drain regions and adjacent to spacer structures 212. Dielectric fill 510 may be provided to allow for a planarized structure such that the top surface of dielectric fill 510 is co-planar with the top surface of sacrificial gate 210 and spacer structures 212. Dielectric fill 510 may be any suitable dielectric material and may the same material as dielectric layer 214.

Figure 6B:
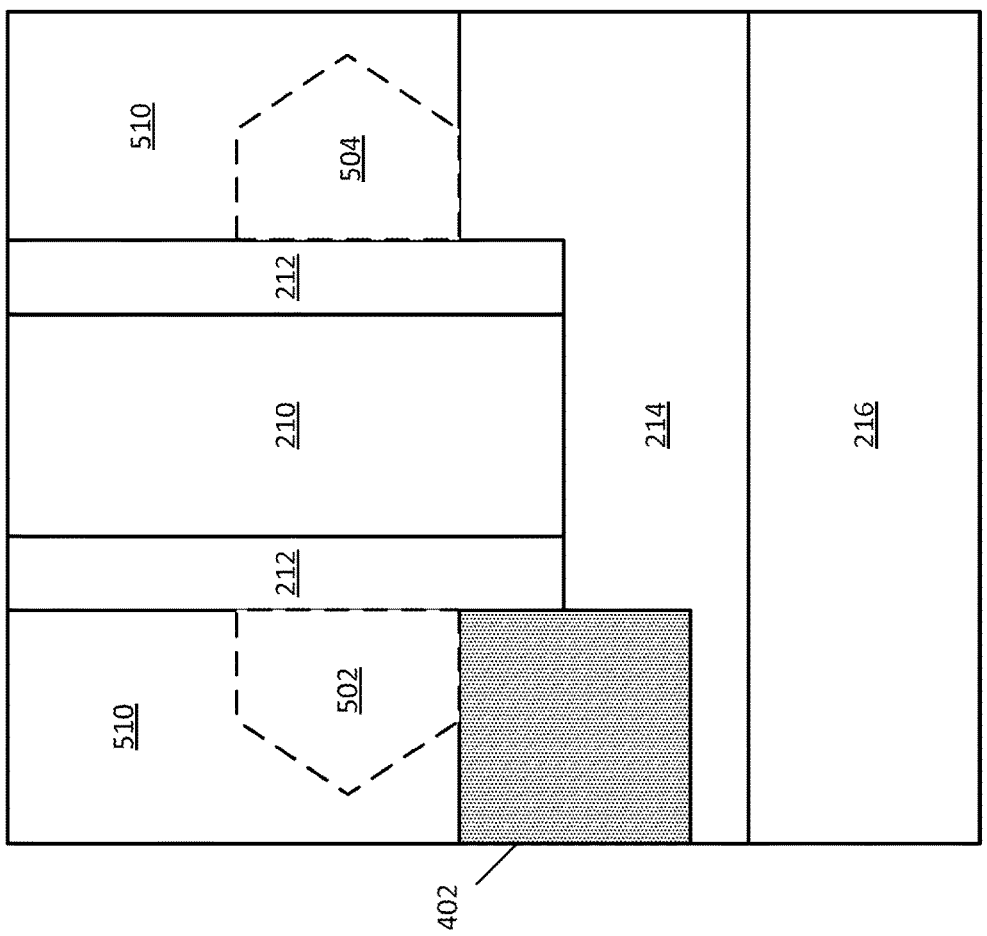
FIGS. 6A and 6B are plan and cross-sectional views, respectively, that illustrate another stage in the example process for forming the integrated circuit configured with a conductive backside structure, in accordance with an embodiment of the present disclosure.
Figure 6A:
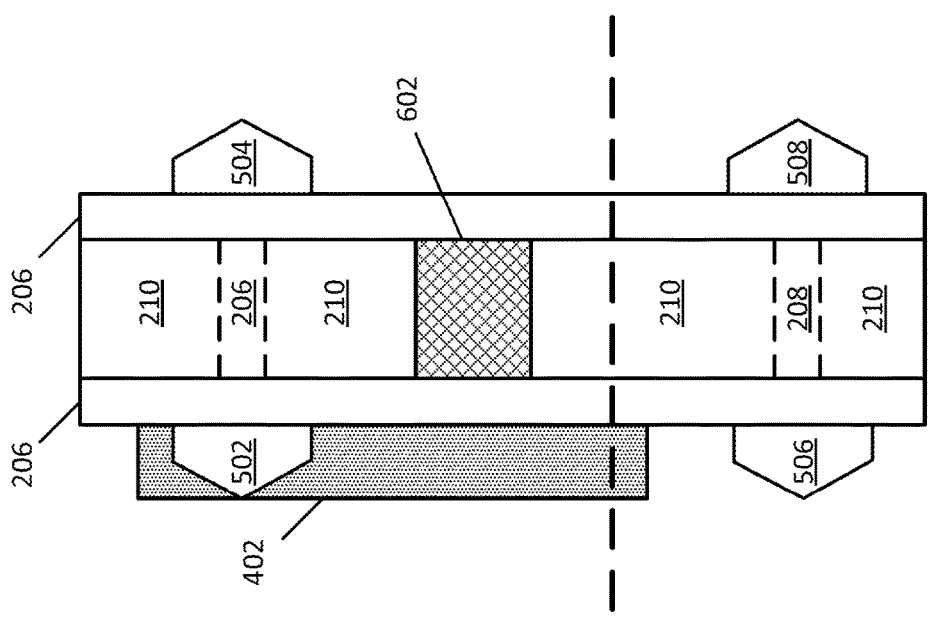

FIGS. 6A and 6B depict respective plan and cross-section views of the structure shown in FIGS. 5A and 5B following the formation of a gate cut 602, according to an embodiment. According to some such embodiments, a portion of sacrificial gate 210 between first fin 206 and second fin 208 is removed using an anisotropic etching process. The recess is then filled with a dielectric material to form gate cut 602, thus separating two portions of sacrificial gate 210. Gate cut 602 can be any suitably insulating material, such as silicon nitride, silicon oxynitride, or silicon oxycarbonitride.

Figure 7B:
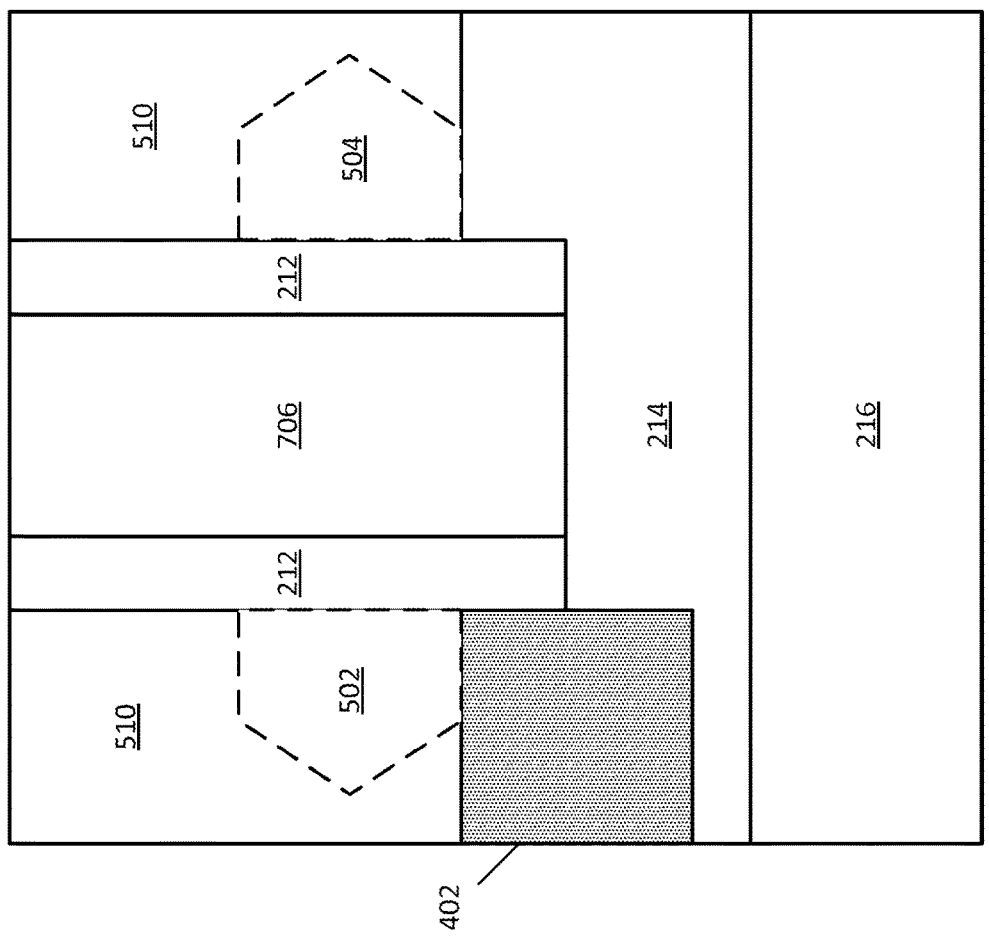
FIGS. 7A and 7B are plan and cross-sectional views, respectively, that illustrate another stage in the example process for forming the integrated circuit configured with a conductive backside structure, in accordance with an embodiment of the present disclosure.
Figure 7A:
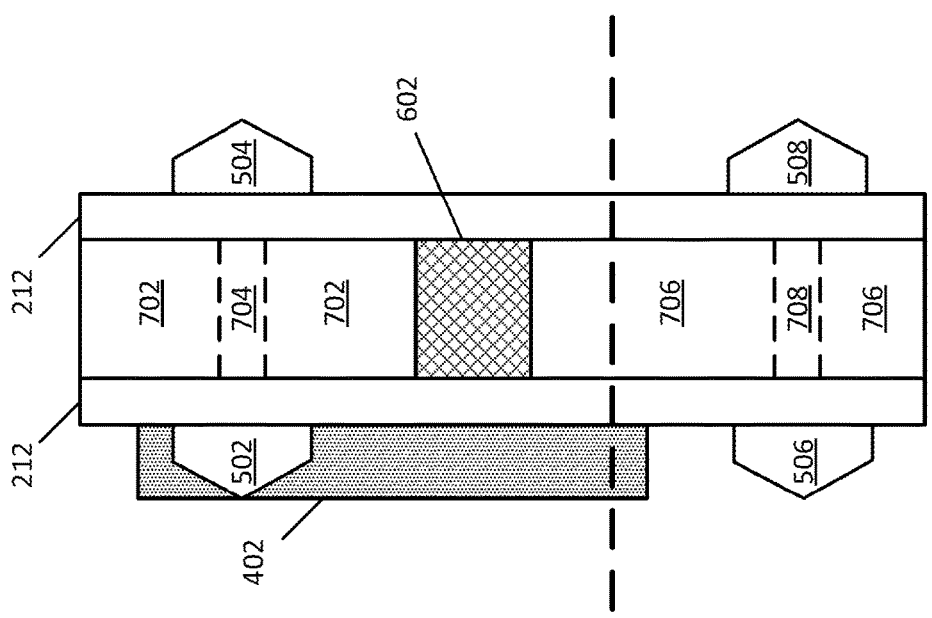

FIGS. 7A and 7B depict respective plan and cross-section views of the structure shown in FIGS. 6A and 6B following the removal of sacrificial gate 210 and formation of different gate structures, according to an embodiment. An isotropic etching process may be used to remove sacrificial gate 210 from between spacer structures 212. Removing sacrificial gate 210 further exposes first fin 206 and second fin 208 between spacer structures 212. In some embodiments, sacrificial layers within each of first fin 206 and second fin 208 are removed to form suspended nanoribbons or nanowires between spacer structures 212. In any case, a first gate structure 702 is formed over a first semiconductor material 704 between spacer structures 212, where first semiconductor material 704 is in the form of one or more nanoribbons or a fin extending between first source region 502 and first drain region 504. Similarly, a second gate structure 706 is formed over a second semiconductor material 708 between spacer structures 212, where second semiconductor material 708 is in the form of one or more nanoribbons or a fin extending between second source region 506 and second drain region 508. Gate cut 602 isolates first gate structure 702 from second gate structure 706.

As noted above, each of first gate structure 702 and second gate structure 706 includes a gate dielectric directly on the first and second semiconductor material, respectively, and a gate electrode over the gate dielectric. The gate dielectric may be conformally deposited around each of first and second semiconductor material 704/708 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, molybdenum nitride, niobium nitride, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first and second semiconductor materials 704/708, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

In some embodiments, one or more top-side contacts can be made to any source region, drain region, or gate structure. For example, at least a portion of dielectric fill 510 over first drain region 504 may be removed and replaced with a conductive material to form a top-side contact to first drain region 504.

Figure 8B:
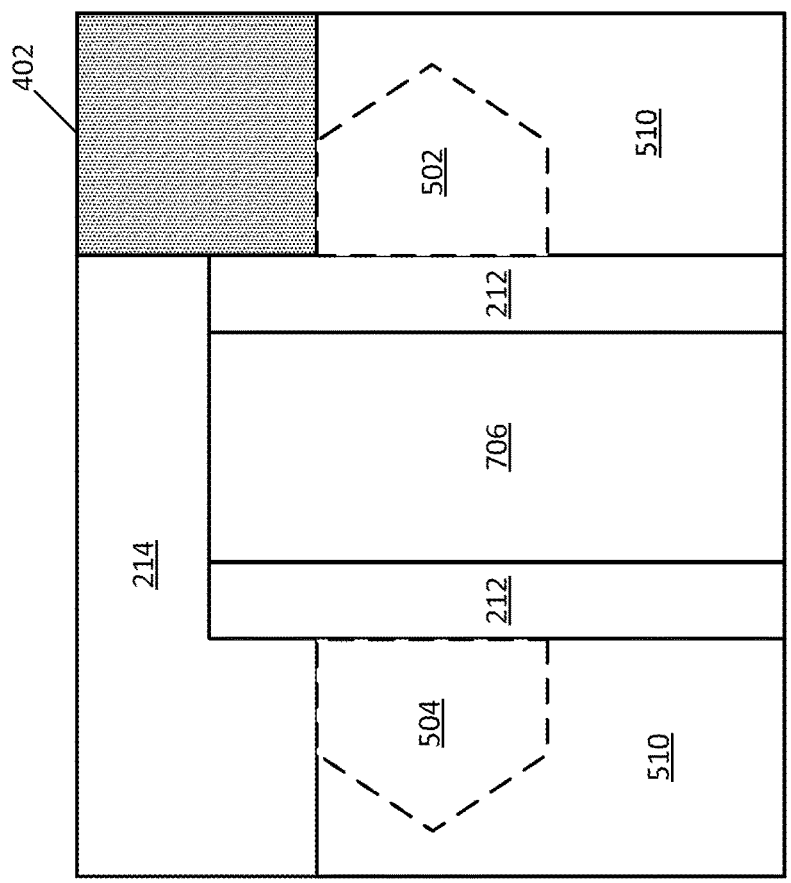
FIGS. 8A and 8B are plan and cross-sectional views, respectively, that illustrate another stage in the example process for forming the integrated circuit configured with a conductive backside structure, in accordance with an embodiment of the present disclosure.
Figure 8A:
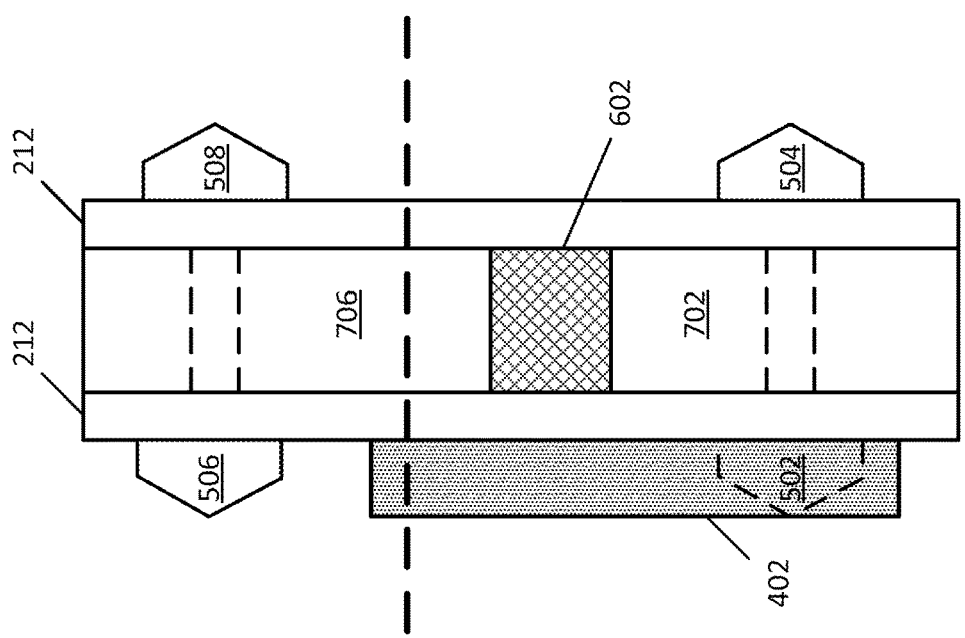

FIGS. 8A and 8B depict respective plan and cross-section views of the structure shown in FIGS. 7A and 7B following the removal of substrate 216, according to an embodiment. The plan and cross-section views have been flipped to signify that backside processing is performed for the remainder of the fabrication steps. Substrate 216 may be removed using one or more etching processes or polishing steps. In some examples, various grinding and polishing processes are used to remove substrate 216. For example, abrasive grinding is used for bulk removal of substrate 216 followed by finer grinding and polishing using chemical mechanical polishing (CMP). According to some embodiments, substrate 216 is removed from the backside until sacrificial layer 402 is exposed.

Figure 9B:
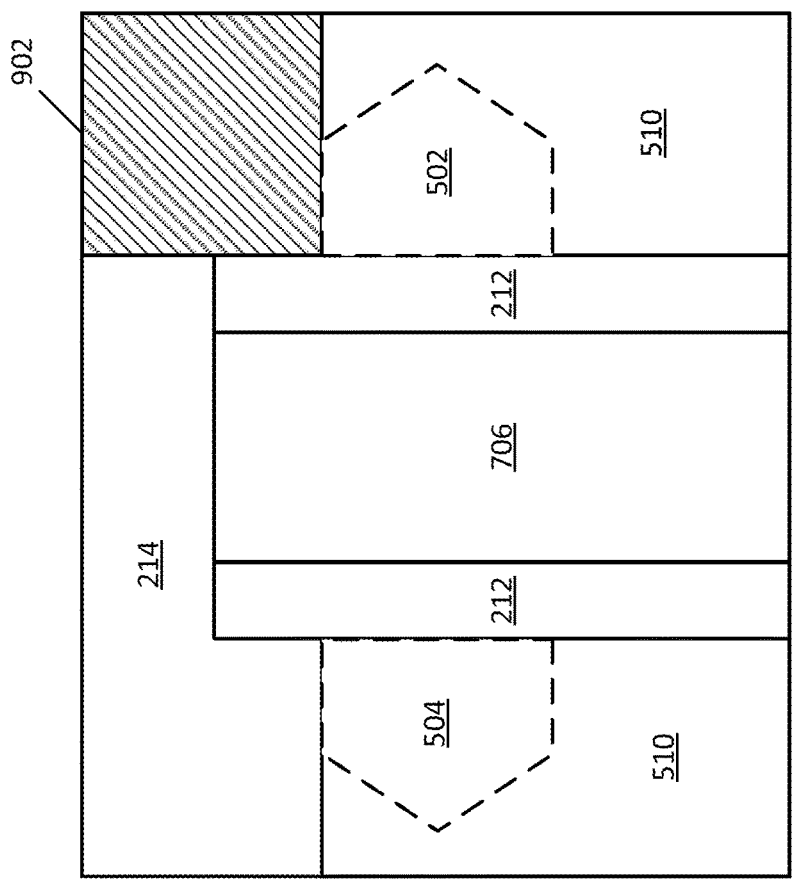
FIGS. 9A and 9B are plan and cross-sectional views, respectively, that illustrate another stage in the example process for forming the integrated circuit configured with a conductive backside structure, in accordance with an embodiment of the present disclosure.
Figure 9A:
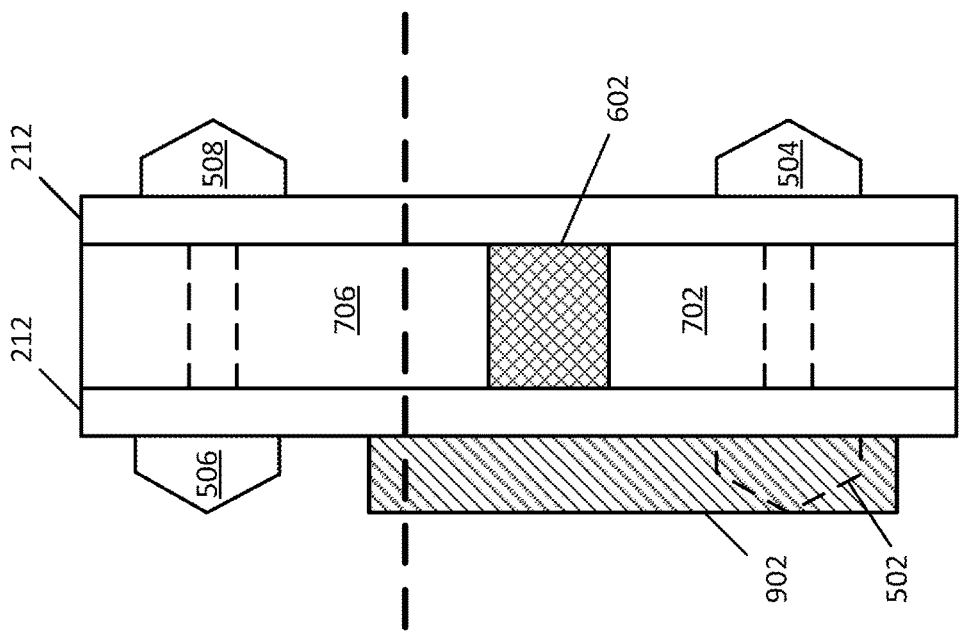

FIGS. 9A and 9B depict respective plan and cross-section views of the structure shown in FIGS. 8A and 8B following the replacement of sacrificial layer 402 with a first conductive layer 902, according to an embodiment. An isotropic etching process may be performed to remove sacrificial layer 402 thus leaving behind a trench extending along a length of spacer structure 212 and exposing an underside of first source region 502. The trench may then be filled with a conductive material to form first conductive layer 902. According to some embodiments, first conductive layer 902 contacts at least a portion of first source region 502 and can include any suitably conductive material, such as tungsten, copper, ruthenium, titanium, or any alloy thereof.

Figure 10B:
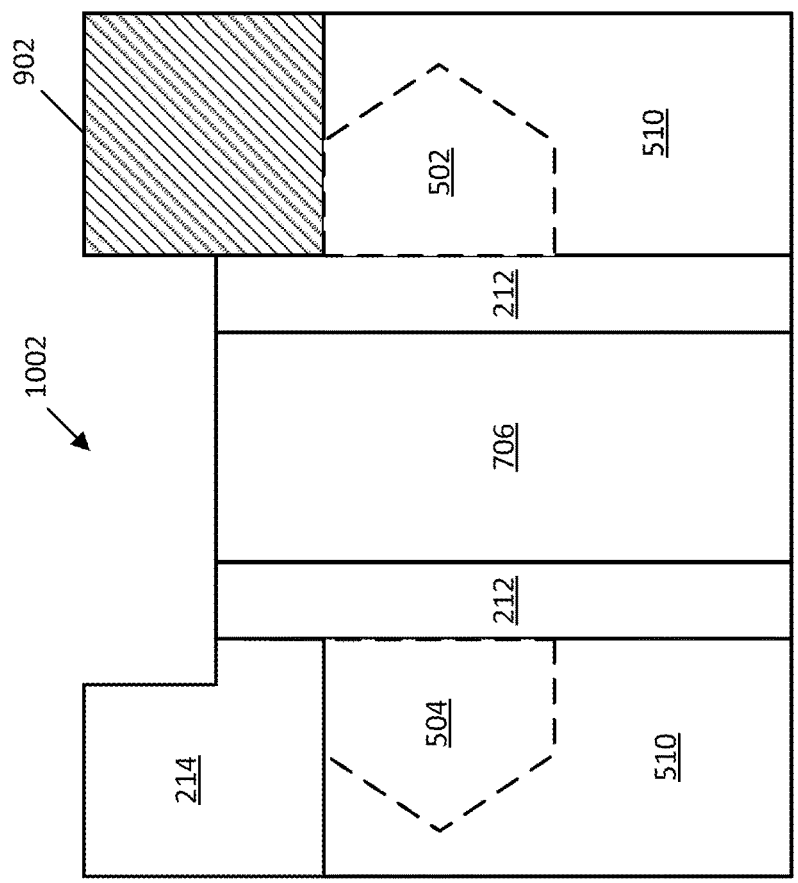
FIGS. 10A and 10B are plan and cross-sectional views, respectively, that illustrate another stage in the example process for forming the integrated circuit configured with a conductive backside structure, in accordance with an embodiment of the present disclosure.
Figure 10A:
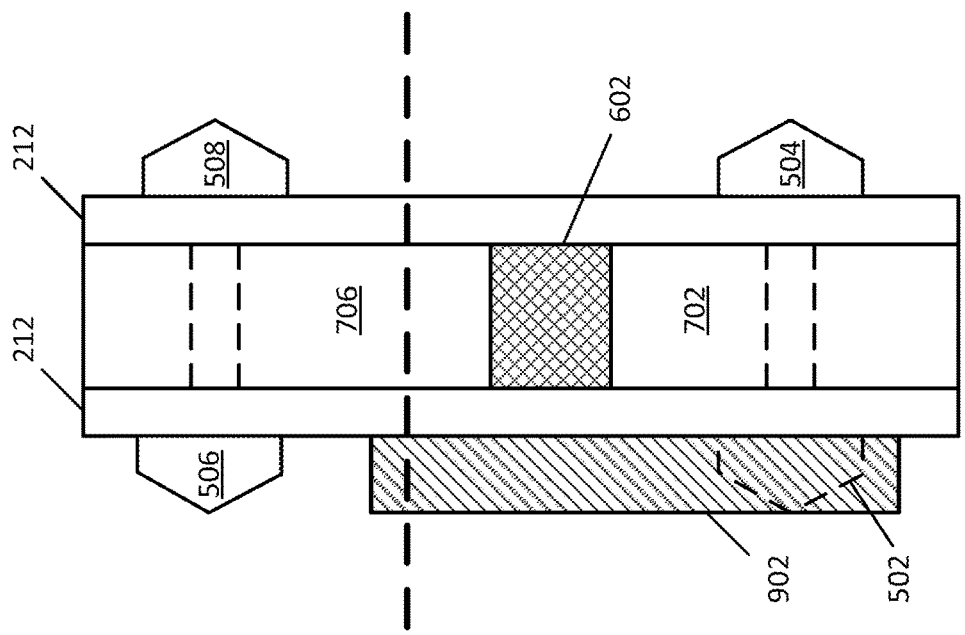

FIGS. 10A and 10B depict respective plan and cross-section views of the structure shown in FIGS. 9A and 9B following the formation of a backside trench 1002, according to an embodiment. As seen in the cross-section view of FIG. 10B, a portion of dielectric layer 214 is removed from the backside to expose at least a portion of the bottom surface of second gate structure 706. More specifically, trench 1002 exposes the conductive electrode portion of gate structure 706 (thus etching through any gate dielectric), according to some embodiments. Trench 1002 may be formed via an anistropic etching process through dielectric layer 214. According to some embodiments, trench 1002 is formed directly adjacent to first conductive layer 902 and may extend away from conductive layer 902 further than the far edge of spacer structure 212.

Figure 11B:
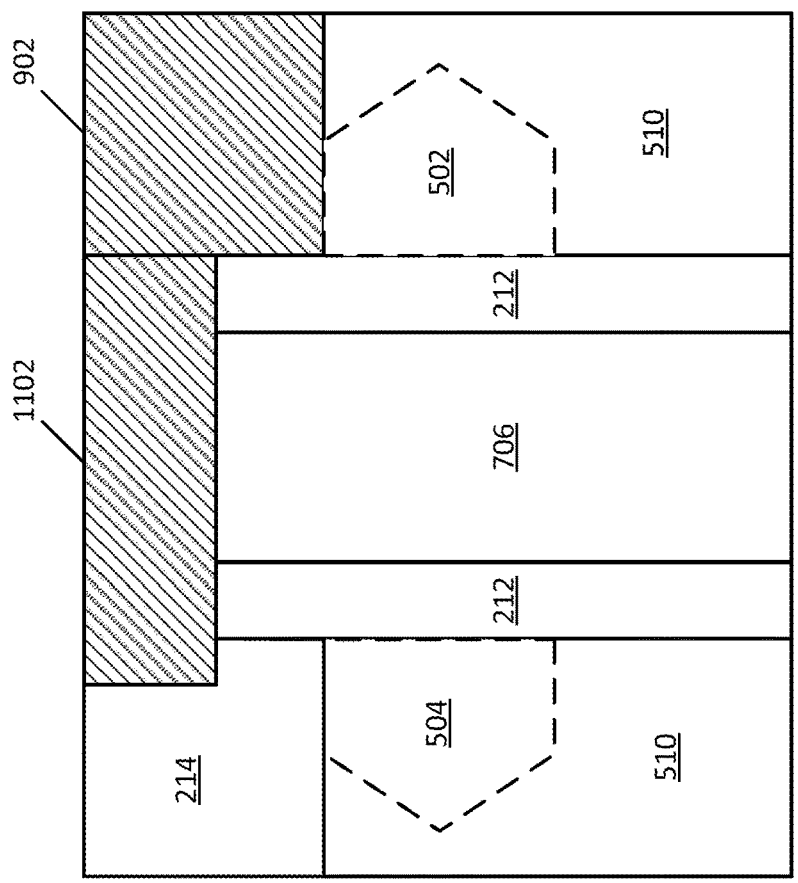
FIGS. 11A and 11B are plan and cross-sectional views, respectively, that illustrate another stage in the example process for forming the integrated circuit configured with a conductive backside structure, in accordance with an embodiment of the present disclosure.
Figure 11A:
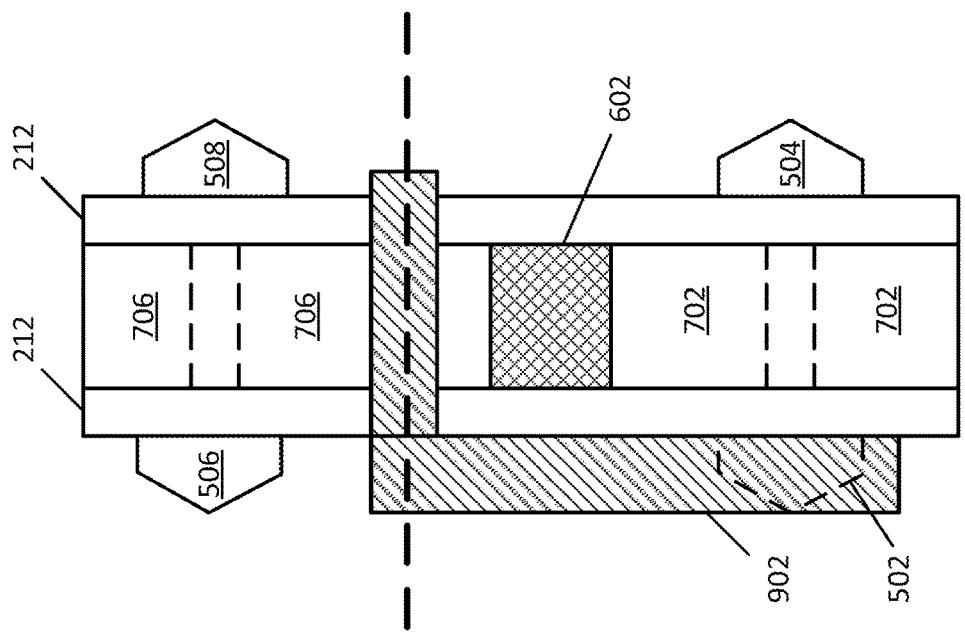

FIGS. 11A and 11B depict respective plan and cross-section views of the structure shown in FIGS. 10A and 10B following the formation of second conductive layer 1102 within trench 1002, according to an embodiment. According to some such embodiments, second conductive layer 1102 contacts at least a portion of both second gate structure 706 and first conductive layer 902 and can include any suitably conductive material, such as tungsten, copper, ruthenium, titanium, or any alloy thereof. In some embodiments, first conductive layer 902 and second conductive layer 1102 include the same conductive material. Together, first conductive layer 902 and second conductive layer 1102 form a backside conductive contact that acts like a shunt contact between first source region 502 and second gate structure 706. A seam is illustrated between first conductive layer 902 and second conductive layer 1102 to highlight that two different deposition processes have been performed. However, in some embodiments, a single metal deposition process can be used to form both first conductive layer 902 and second conductive layer 1102 at the same time as a single conductive material. Additionally, in situations where first conductive layer 902 and second conductive layer 1102 are the same material, the seam between the two layers may not be visible.

Second conductive layer 1102 extends lengthwise across at least a portion of second gate structure 706 in a different direction than the lengthwise direction of first conductive layer 902. That is, first conductive layer 902 extends lengthwise in a first direction to contact the underside of source region 502 and second conductive layer 1102 extends lengthwise in a second direction different from the first direction to contact the underside of second gate structure 706. In some embodiments, the second direction is substantially orthogonal to the first direction.

Figures 12A, 12B:
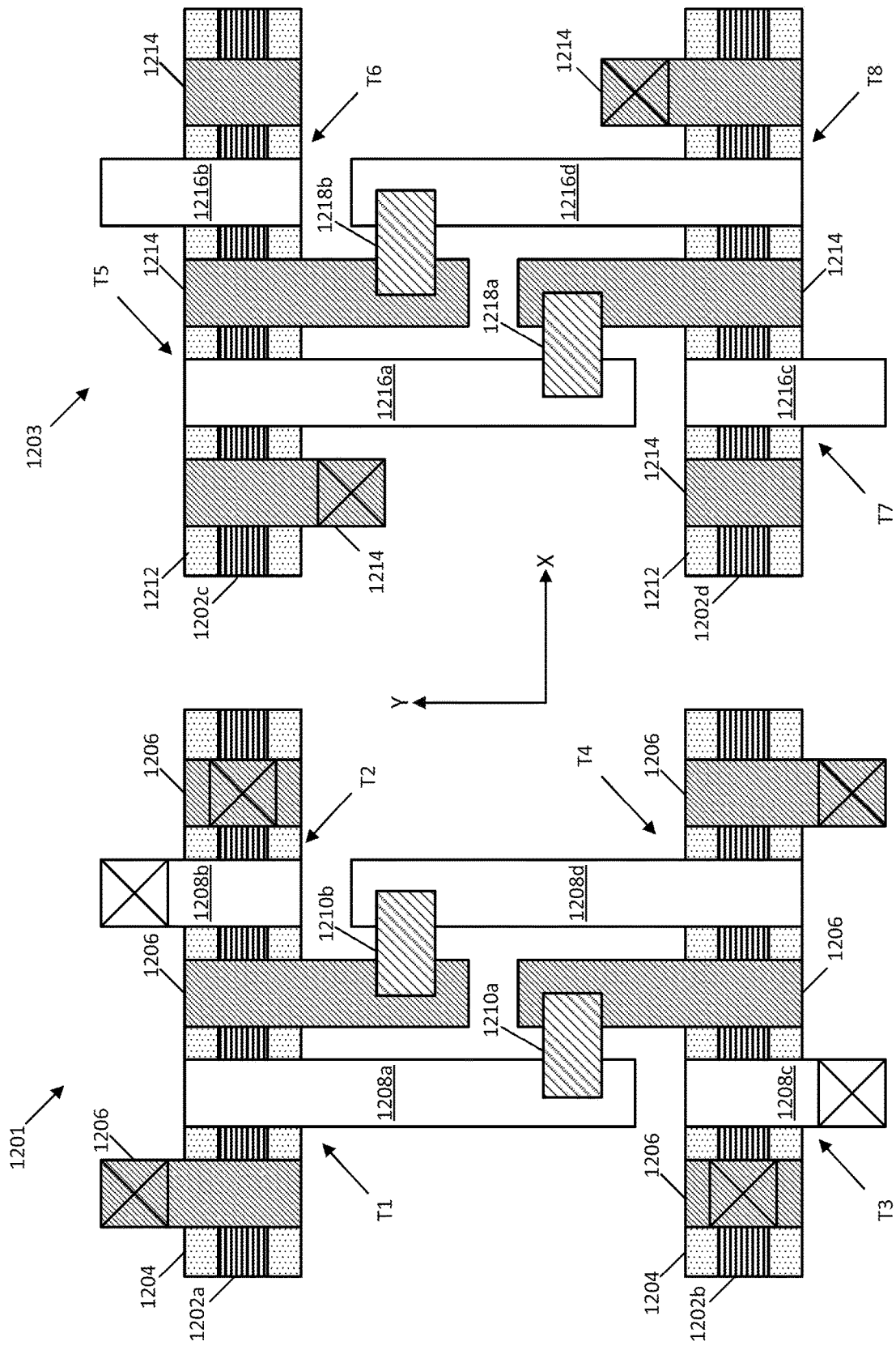
FIGS. 12A and 12B are plan views of an example layout of an SRAM bit cell using a stacked transistor configuration, in accordance with an embodiment of the present disclosure.

FIGS. 12A and 12B depict plan views of an example integrated circuit layout for forming an SRAM cell, according to an embodiment. The first layout 1201 depicted in FIG. 12A includes a series of transistors T1-T4 that are aligned vertically over a second layout 1203 depicted in FIG. 12B, such that transistor T1 aligns directly over transistor T5, transistor T2 aligns directly over transistor T6, transistor T3 aligns directly over transistor T7, and transistor T4 aligns directly over transistor T8.

First layout 1201 includes a first semiconductor region 1202$a$ and a second semiconductor region 1202$b$ that each extend along the X direction and are separated from one another in the Y direction. Doped source or drain regions 1204 are formed along both first semiconductor region 1202$a$ and a second semiconductor region 1202$b$. According to some embodiments, all source or drain regions 1204 are doped with n-type dopants and all semiconductor regions 1202$a$ and 1202$b$ are doped with p-type dopants such that each of transistors T1-T4 are NMOS devices. One or more source/drain contact traces 1206 are formed in the Y direction to intersect different source or drain regions 1204 and provide an electrical contact to such regions. Each of the transistors T1-T4 is defined by a gate structure 1208$a$-1208$d$ that intersects either first semiconductor region 1202$a$ or second semiconductor region 1202$b$ and is flaked by source or drain regions 1204. Shunt contacts 1210$a$ and 1210$b$ are conductive contacts that are formed to electrically couple gate structure 1208$a$ with a source/drain contact trace 1206 and to couple gate structure 1208$d$ with another source/drain contact trace 1206.

Second layout 1203 includes an almost identical scheme to first layout 1201, albeit with different routing connections. Accordingly, second layout 1203 includes a third semiconductor region 1202$c$ and a fourth semiconductor region 1202$d$ that each extend along the X direction and are separated from one another in the Y direction. Third semiconductor region 1202$c$ runs directly over first semiconductor region 1202$a$ and fourth semiconductor region 1202$d$ runs directly over second semiconductor region 1202$b$. Doped source or drain regions 1212 are formed along both third semiconductor region 1202$c$ and a fourth semiconductor region 1202$d$. According to some embodiments, all source or drain regions 1212 are doped with p-type dopants and all semiconductor regions 1202$c$ and 1202$d$ are doped with n-type dopants such that each of transistors T5-T8 are PMOS devices. One or more source/drain contact traces 1214 are formed in the Y direction to intersect different source or drain regions 1212 and provide an electrical contact to such regions. Each of the transistors T5-T8 is defined by a gate structure 1216$a$-1216$d$ that intersects either third semiconductor region 1202$c$ or fourth semiconductor region 1202$d$ and is flanked by source or drain regions 1212. Shunt contacts 1218$a$ and 1218$b$ are conductive contacts that are formed to electrically couple gate structure 1216$a$ with a source/drain contact trace 1214 and to couple gate structure 1216$d$ with another source/drain contact trace 1214.

The need to use the shunt contacts limits the ability to compact the layout into a smaller size. However, by leveraging the use of backside shunt contacts, such as the embodiments described herein, the SRAM cell footprint can be further reduced by up to 50% when using stacked n/p devices.

Figure 13B:
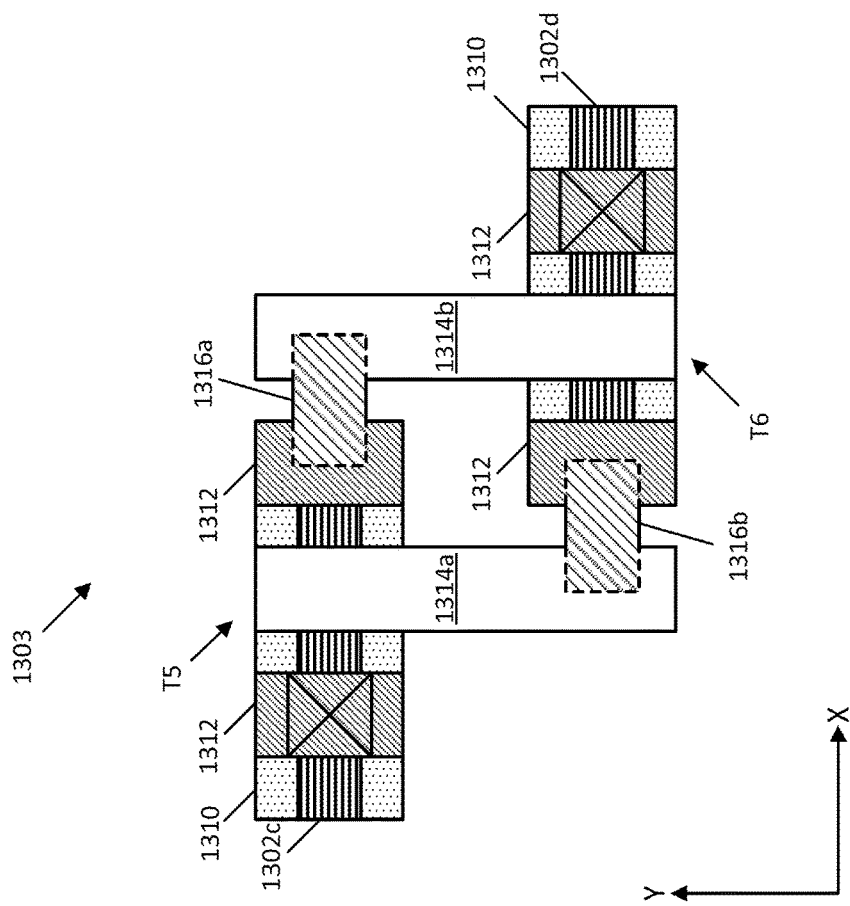
FIGS. 13A and 13B are plan views of another example layout of an SRAM bit cell using a stacked transistor configuration and conductive backside structures, in accordance with an embodiment of the present disclosure.
Figure 13A:
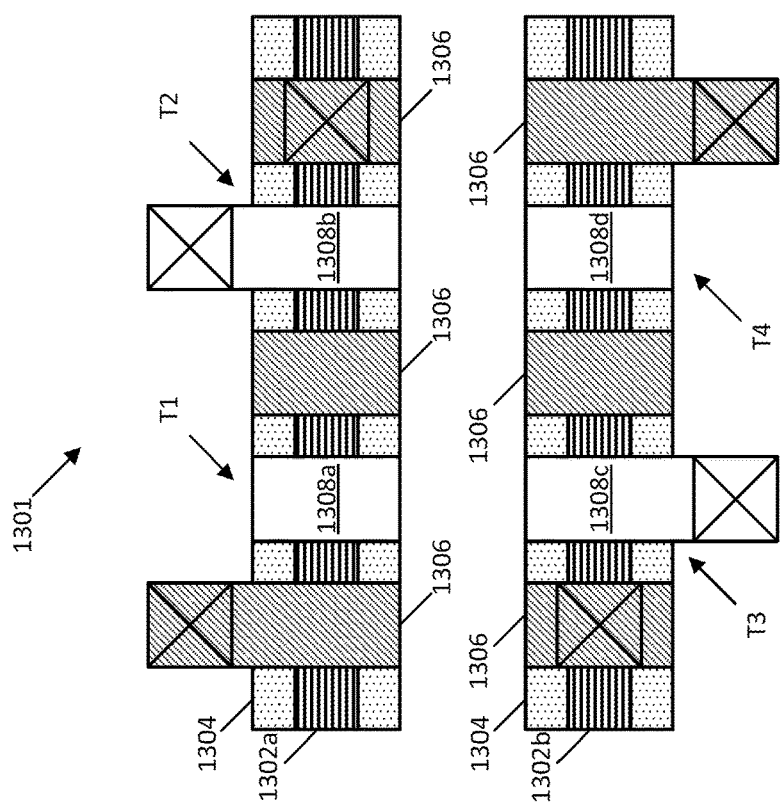

FIGS. 13A and 13B depict plan views of an example integrated circuit layout for forming an SRAM cell, according to an embodiment. The first layout 1301 depicted in FIG. 13A includes a series of transistors T1-T4 that are aligned vertically over a second layout 1303 depicted in FIG. 12B, such that transistor T1 aligns directly over transistor T5, and transistor T4 aligns directly over transistor T6.

First layout 1301 includes a first semiconductor region 1302$a$ and a second semiconductor region 1302$b$ that each extend along the X direction and are separated from one another in the Y direction. Doped source or drain regions 1304 are formed along both first semiconductor region 1302$a$ and a second semiconductor region 1302$b$. According to some embodiments, all source or drain regions 1304 are doped with n-type dopants and all semiconductor regions 1302$a$ and 1302$b$ are doped with p-type dopants such that each of transistors T1-T4 are NMOS devices. One or more source/drain contact traces 1306 are formed in the Y direction to intersect different source or drain regions 1304 and provide an electrical contact to such regions. Each of the transistors T1-T4 is defined by a gate structure 1308$a$-1308$d$ that intersects either first semiconductor region 1302$a$ or second semiconductor region 1302$b$ and is flanked by source or drain regions 1304.

Second layout 1303 includes a third semiconductor region 1302$c$ and a fourth semiconductor region 1302$d$ that each extend along the X direction and are separated from one another in the Y direction. Third semiconductor region 1302$c$ runs directly over first semiconductor region 1302$a$ and fourth semiconductor region 1302$d$ runs directly over second semiconductor region 1302$b$. Doped source or drain regions 1310 are formed along both third semiconductor region 1302$c$ and a fourth semiconductor region 1302$d$. According to some embodiments, all source or drain regions 1310 are doped with p-type dopants and all semiconductor regions 1302$c$ and 1302$d$ are doped with n-type dopants such both transistors T5 and T6 are PMOS devices. One or more source/drain contact traces 1312 are formed in the Y direction to intersect different source or drain regions 1310 and provide an electrical contact to such regions. Transistors T5 and T6 are each defined by a gate structure 1314$a$ and 1314$b$ that intersect either third semiconductor region 1302$c$ or fourth semiconductor region 1302$d$ and are flanked by source or drain regions 1310. According to some embodiments, backside shunt contacts 1316$a$ and 1316$b$ are used to couple different transistor structures together. For example, backside shunt contact 1316$a$ electrically couples a backside of gate structure 1314$b$ of transistor T6 to a backside of source or drain region 1310 associated with transistor T5. Similarly, backside shunt contact 1316$b$ electrically couples a backside of gate structure 1314$a$ of transistor T5 to a backside of source or drain region 1310 associated with transistor T6. Backside shunt contacts 1316$a$ and 1316$b$ may be formed using the process described with reference to FIGS. 2-11. By using the backside shunt contacts, more space is freed up for top-side interconnect routing and the overall footprint of the cell can be reduced. In this example, the footprint of an SRAM cell was reduced by up to 50% when using the backside shunt contacts 1316$a$ and 1316$b$.

Figure 14:
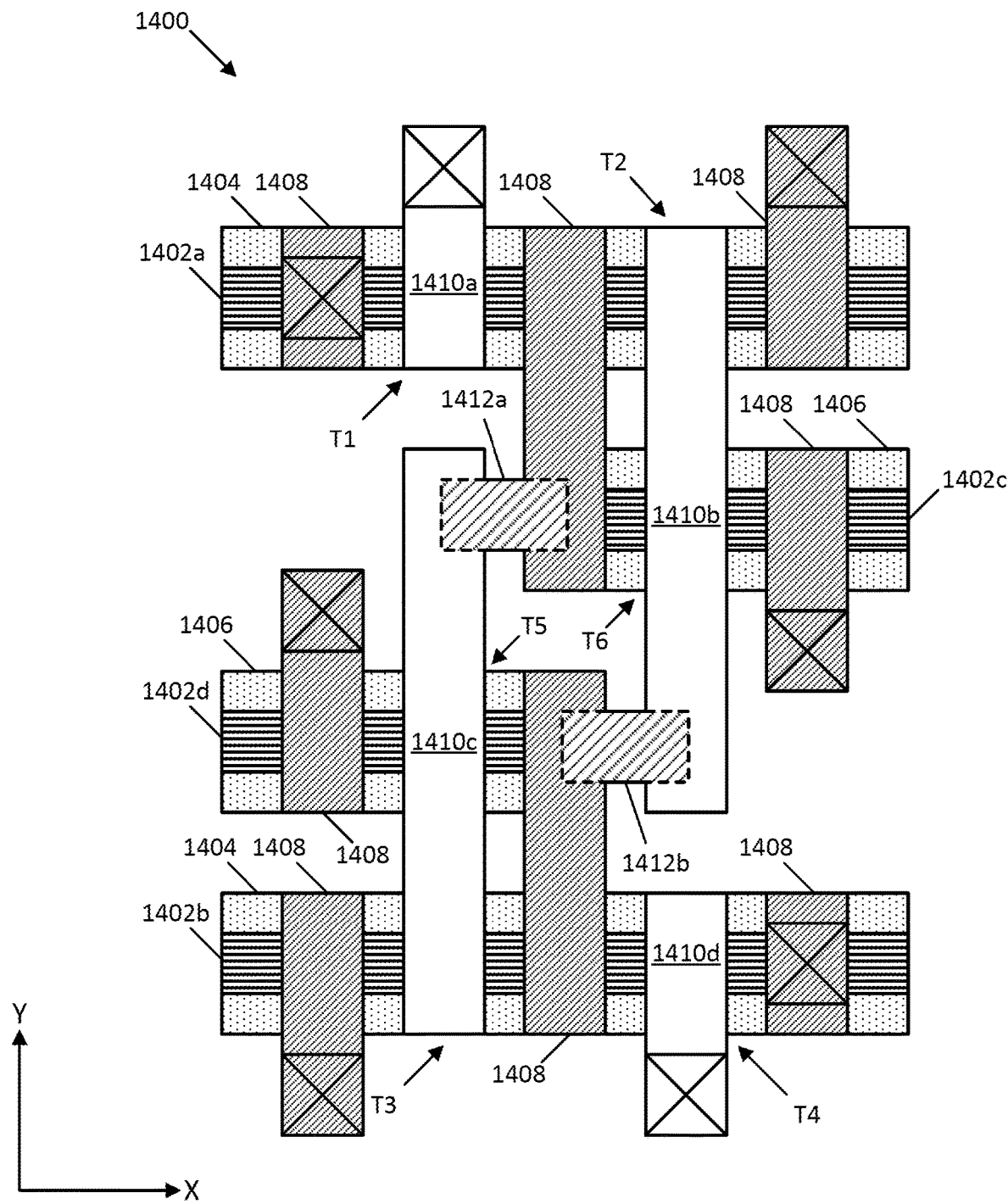
FIG. 14 is a plan view of another example layout of an SRAM bit cell using a non-stacked transistor configuration and conductive backside structures, in accordance with an embodiment of the present disclosure.

It should be noted that while the example layouts described in FIGS. 12A, 12B, 13A, and 13B utilize a stacked transistor configuration, the use of backside shunt contacts, such as the embodiments described herein, are equally applicable to non-stacked configurations (e.g., a single level of transistor devices). FIG. 14 depicts a plan view of an example integrated circuit layout 1400 for forming an SRAM cell using non-stacked transistors, according to an embodiment.

Layout 1400 includes a first semiconductor region 1402$a$, a second semiconductor region 1402$b$, a third semiconductor region 1402$c$, and a fourth semiconductor region 1402$d$ that each extend along the X direction and are separated from one another in the Y direction. First doped source or drain regions 1404 are formed along both first semiconductor region 1402$a$ and second semiconductor region 1402$b$. According to some embodiments, first source or drain regions 1404 are doped with n-type dopants and semiconductor regions 1402$a$ and 1402$b$ are doped with p-type dopants such that each of transistors T1-T4 are NMOS devices. Second doped source or drain regions 1406 are formed along both third semiconductor region 1402*c* and fourth semiconductor region 1402*d*. According to some embodiments, second doped source or drain regions 1406 are doped with p-type dopants and semiconductor regions 1402*c* and 1402*d* are doped with n-type dopants such that both transistors T5 and T6 are PMOS devices.

One or more source/drain contact traces 1408 are formed in the Y direction to intersect different source or drain regions 1404 and/or 1406 to provide an electrical contact to such regions. Each of the transistors T1-T4 is defined by a gate structure 1410*a*-1410*d* that intersects either first semiconductor region 1402*a* or second semiconductor region 1402*b* and is flanked by source or drain regions 1404. Similarly, transistors T5 and T6 are each defined by a gate structure 1410*c* or 1410*d* that intersects either third semiconductor region 1402*c* or fourth semiconductor region 1402*d* and is flanked by source or drain regions 1406.

According to some embodiments, backside shunt contacts 1412*a* and 1412*b* are used to couple different transistor structures together. For example, backside shunt contact 1412*a* electrically couples a backside of gate structure 1410*c* of transistors T3 and T5 to a backside of source or drain region 1406 associated with transistor T6. Similarly, backside shunt contact 1412*b* electrically couples a backside of gate structure 1410*b* of transistors T2 and T6 to a backside of source or drain region 1406 associated with transistor T5. Backside shunt contacts 1412*a* and 1412*b* may be formed using the process described with reference to FIGS. 2-11.

Figure 15:
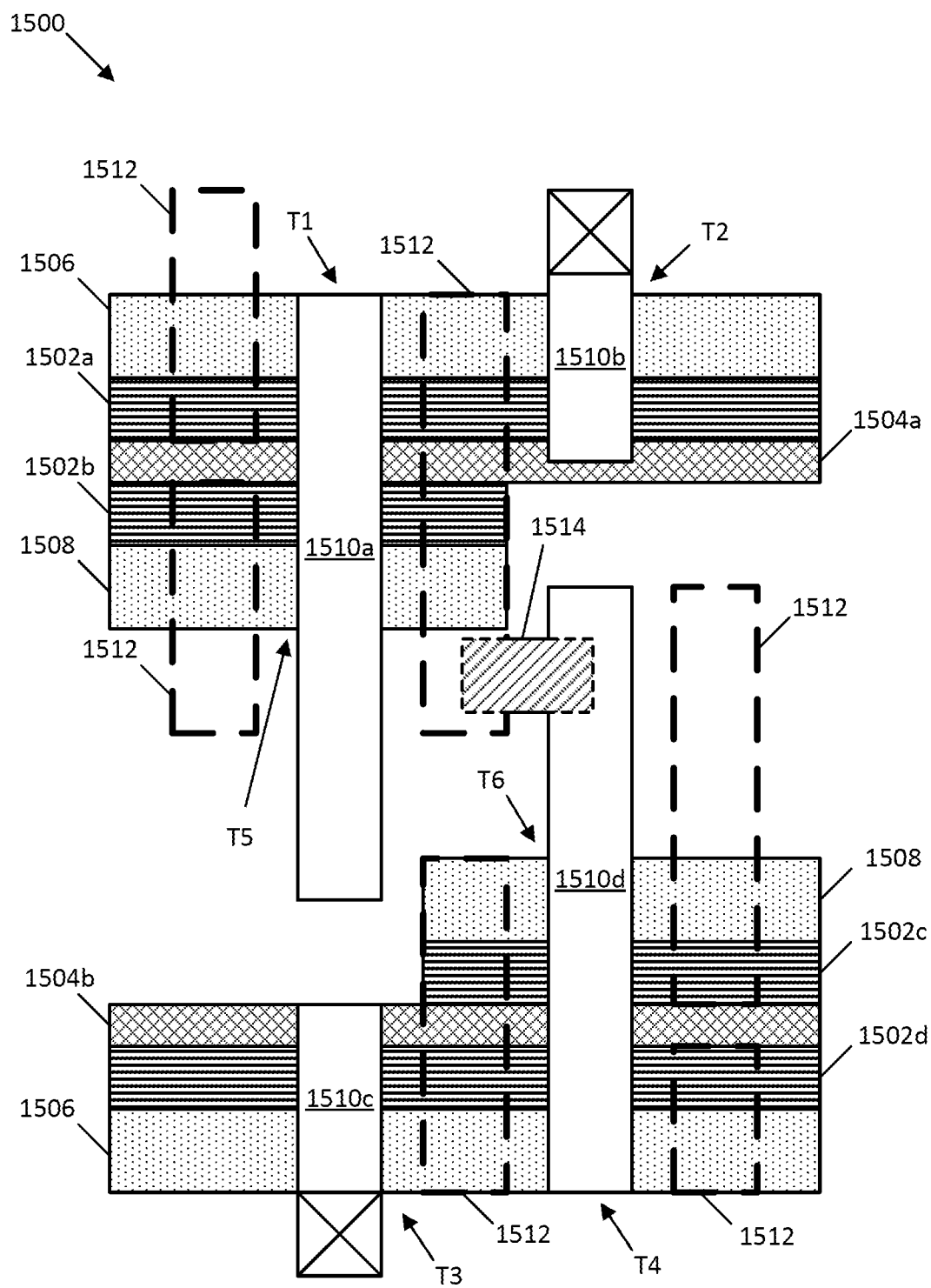
FIG. 15 is a plan view of another example portion of a layout of an SRAM bit cell using a forksheet transistor configuration and conductive backside structures, in accordance with an embodiment of the present disclosure.

The backside shunt contacts described herein may also be used with forksheet transistor configurations, according to some embodiments. FIG. 15 depicts a plan view of an example integrated circuit layout 1500 for forming a portion of an SRAM cell using forksheet transistors, according to an embodiment. It should be noted that frontside contacts and front side interconnects are not illustrated in layout 1500 for clarity, as such features would obscure the lower level features being depicted. Power rails (e.g., VCC or VSS) are also not shown for clarity.

Layout 1500 includes a first semiconductor region 1502*a* and a second semiconductor region 1502*b* on either side of a first dielectric spine 1504*a* in a forksheet configuration. Similarly, a third semiconductor region 1502*c* and a fourth semiconductor region 152*d* are on either side of a second dielectric spine 1504*b* in a forksheet configuration. Each of the semiconductor regions extends parallel to one another along the X direction and are separated from one another in the Y direction. First doped source or drain regions 1506 are formed along both first semiconductor region 1502*a* and fourth semiconductor region 1502*d*. According to some embodiments, first source or drain regions 1506 are doped with n-type dopants and semiconductor regions 1502*a* and 1502*d* are doped with p-type dopants such that each of transistors T1-T4 are NMOS devices. Second doped source or drain regions 1508 are formed along both second semiconductor region 1502*b* and third semiconductor region 1502*c*. According to some embodiments, second doped source or drain regions 1508 are doped with p-type dopants and semiconductor regions 1502*b* and 1502*c* are doped with n-type dopants such that both transistors T5 and T6 are PMOS devices.

Each of the transistors T1-T4 is defined by a gate structure 1510*a*-1510*d* that intersects either first semiconductor region 1502*a* or fourth semiconductor region 1502*d* and is flanked by source or drain regions 1506. Similarly, transistors T5 and T6 are each defined by a gate structure 1510*a* or 1510*d* that intersects either second semiconductor region 1502*b* or third semiconductor region 1502*c* and is flanked by source or drain regions 1508.

According to some embodiments, backside conductive trenches 1512 are formed to connect various transistor structures together. Backside conductive trenches 1512 may be formed after all front side (e.g., FEOL) structures have been formed and may include any suitably conductive material.

According to some embodiments, a backside shunt contact 1514 is provided to couple different transistor structures together. For example, backside shunt contact 1514 electrically couples a backside of gate structure 1510*d* of transistors T4 and T6 to backside conductive trench 1512, which further contacts first source or drain region 1506 of transistor T1 and second source or drain region 1508 of transistor T5. Backside shunt contact 1514 may be formed using the process described with reference to FIGS. 2-11 where a portion of backside shunt contact 1514 may be formed at the same time as backside conductive trenches 1512. Accordingly, in some embodiments, backside shunt contact 1514 along with its coupled backside shunt contact 1512 are together a backside conductive structure used to electrically couple gate structure 1510*d* (e.g., the gate of transistors T4 and T6) with the second source or drain region 1508 of transistor T5 and the first source or drain region 1506 of transistor T1.

Figure 16:
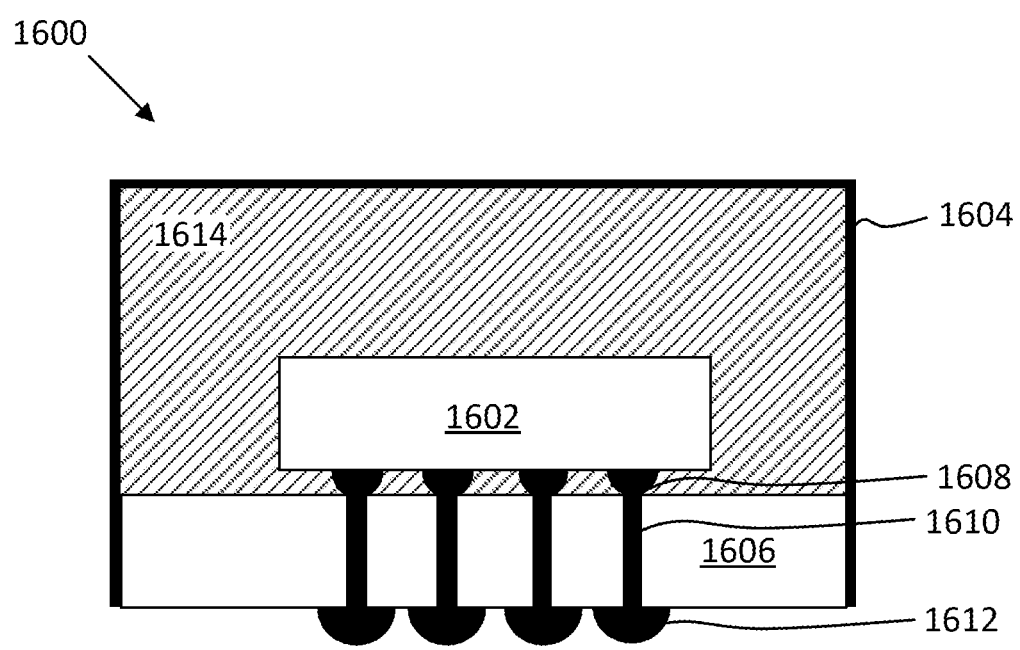
FIG. 16 illustrates a cross-section view of a chip package containing one or more semiconductor dies, in accordance with some embodiments of the present disclosure.

FIG. 16 illustrates an example embodiment of a chip package 1600. As can be seen, chip package 1600 includes one or more dies 1602. One or more dies 1602 may include at least one integrated circuit having semiconductor devices, such as any of the semiconductor devices disclosed herein. One or more dies 1602 may include any other circuitry used to interface with other devices formed on the dies, or other devices connected to chip package 1600, in some example configurations.

As can be further seen, chip package 1600 includes a housing 1604 that is bonded to a package substrate 1606. The housing 1604 may be any standard or proprietary housing, and provides, for example, electromagnetic shielding and environmental protection for the components of chip package 1600. The one or more dies 1602 may be conductively coupled to a package substrate 1606 using connections 1608, which may be implemented with any number of standard or proprietary connection mechanisms, such as solder bumps, ball grid array (BGA), pins, or wire bonds, to name a few examples. Package substrate 1606 may be any standard or proprietary package substrate, but in some cases includes a dielectric material having conductive pathways (e.g., including conductive vias and lines) extending through the dielectric material between the faces of package substrate 1606, or between different locations on each face. In some embodiments, package substrate 1606 may have a thickness less than 1 millimeter (e.g., between 0.1 millimeters and 0.5 millimeters), although any number of package geometries can be used. Additional conductive contacts 1612 may be disposed at an opposite face of package substrate 1606 for conductively contacting, for instance, a printed circuit board (PCB). One or more vias 1610 extend through a thickness of package substrate 1606 to provide conductive pathways between one or more of connections 1608 to one or more of contacts 1612. Vias 1610 are illustrated as single straight columns through package substrate 1606 for ease of illustration, although other configurations can be used (e.g., damascene, dual damascene, through-silicon via). In still other embodiments, vias 1610 are fabricated by multiple smaller stacked vias, or are staggered at different locations across package substrate

1606. In the illustrated embodiment, contacts 1612 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1612, to inhibit shorting.

In some embodiments, a mold material 1614 may be disposed around the one or more dies 1602 included within housing 1604 (e.g., between dies 1602 and package substrate 1606 as an underfill material, as well as between dies 1602 and housing 1604 as an overfill material). Although the dimensions and qualities of the mold material 1614 can vary from one embodiment to the next, in some embodiments, a thickness of mold material 1614 is less than 1 millimeter. Example materials that may be used for mold material 1614 include epoxy mold materials, as suitable. In some cases, the mold material 1614 is thermally conductive, in addition to being electrically insulating.

Methodology

Figure 17:
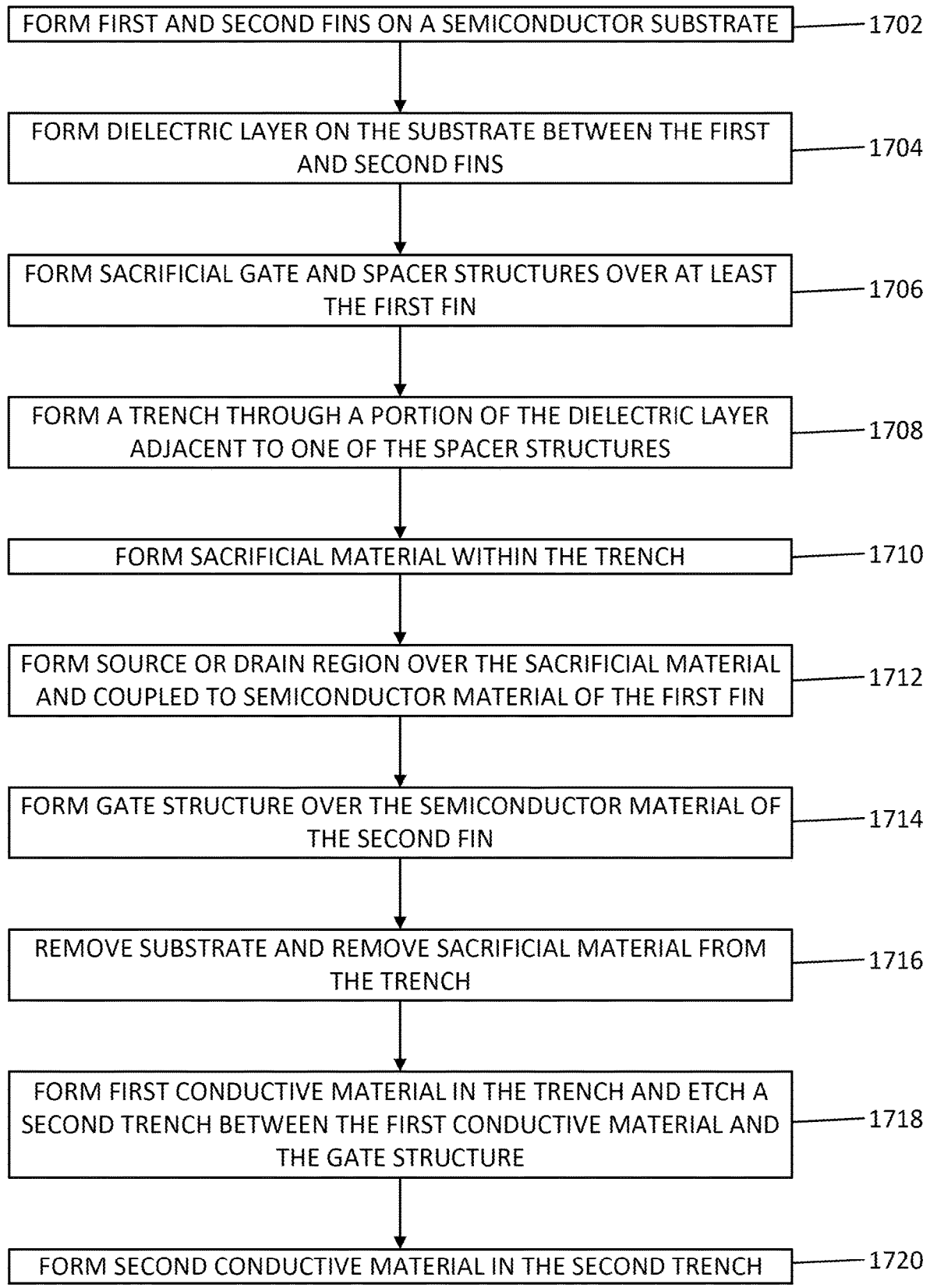
FIG. 17 is a flowchart of a fabrication process for semiconductor device having a conductive backside structure, in accordance with an embodiment of the present disclosure.

FIG. 17 is a flow chart of a method 1700 for forming at least a portion of an integrated circuit, according to an embodiment. Various operations of method 1700 may be illustrated in FIGS. 2A-11A and 2B-111B. However, the correlation of the various operations of method 1700 to the specific components illustrated in the aforementioned figures is not intended to imply any structural and/or use limitations. Rather, the aforementioned figures provide one example embodiment of method 1700. Other operations may be performed before, during, or after any of the operations of method 1700. Some of the operations of method 1700 may be performed in a different order than the illustrated order.

Method 1700 begins with operation 1702 where at least a first and second semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins or deposited into fin-shaped trenches.

Method 1700 continues with operation 1704 where one or more dielectric layers are formed on the substrate between at least the first and second fins. The dielectric layers may act as STI to isolate the fins from one another. Any suitable dielectric material can be used, such as silicon dioxide, aluminum oxide, or silicon oxycarbonitride.

Method 1700 continues with operation 1706 where a sacrificial gate is formed over at least the first fin along with spacer structures on sidewalls of the sacrificial gate, according to some embodiments. In some embodiments, the sacrificial gate and spacer structures also extend over the second fin. The sacrificial gate may include any material that can be safely removed later in the process without etching or otherwise damaging the spacer structures and/or the fin. In some embodiments, the sacrificial gate includes a cap layer that is used to lithographically define the pattern of the sacrificial gate during a RIE process. In some examples, the cap layer comprises silicon nitride while the sacrificial gate comprises polysilicon. The spacer structures may be formed using an etch-back process where spacer material is deposited everywhere and then anisotropically etched to leave the material only on sidewalls of structures including on the sacrificial gate. The spacer structures may include a dielectric material, such as silicon nitride, silicon oxy-nitride, or any formulation of those layers incorporating carbon or boron dopants.

Method 1700 continues with operation 1708 where a trench is formed through a portion of the one or more dielectric layers adjacent to one of the spacer structures, according to some embodiments. In some embodiments, the trench may be formed via an anisotropic etch that also etches away exposed portions of at least the first fin that stick out from underneath the sacrificial gate and spacer structures. In other embodiments, a first etching process is used to remove any portions of the exposed fins while a second etching process is used to form the trench. The trench may have a depth between about 20 nm and about 100 nm.

Method 1700 continues with operation 1710 where a sacrificial material is formed within the trench, according to some embodiments. The sacrificial material forms a layer within the trench and can include any material that can withstand high-temperature semiconductor processes, such as temperatures between 500 C and 800 C. In one example, the sacrificial material includes titanium and nitrogen.

Method 1700 continues with operation 1712 where a source or drain region is formed over the sacrificial material and coupled to the semiconductor material of the first fin, according to some embodiments. Other source or drain regions are also formed for any number of other fins to form any number of transistors. According to some embodiments, the source or drain region is epitaxially grown from the end of the exposed semiconductor material in the first fin. Any semiconductor materials suitable for the source and drain regions can be used (e.g., group IV and group III-V semiconductor materials). Each of the source and drain regions may include multiple layers such as liners and capping layers to improve contact resistance. In any such cases, the composition and doping of the source or drain region over the sacrificial material depends on the polarity (e.g., NMOS or PMOS) of the semiconductor device formed from the first fin. According to some embodiments, the source or drain region directly contacts the sacrificial material as it forms.

Method 1700 continues with operation 1714 where a gate structure is formed over the semiconductor material of at least the second fin, according to some embodiments. In some embodiments, a separate gate structure is formed over the semiconductor material of the first fin and is separated from the gate structure over the semiconductor material of the second fin by a gate cut structure. The sacrificial gate is first removed using an isotropic etching process and the gate structure is formed in the trench left behind between the spacer structures. In some embodiments, sacrificial material layers within the second fin are removed to form suspended nanowires or nanoribbons of semiconductor material before the formation of the gate structure. As noted above, the gate structure includes both a gate dielectric and a gate electrode, each of which can include any number of dielectric or conductive layers.

Method 1700 continues with operation 1716 where the substrate is removed from the backside and the sacrificial material is removed from the trench from the backside, according to some embodiments. The substrate may be removed using one or more etching processes or polishing steps. In some examples, CMP is used to grind down the substrate. According to some embodiments, the substrate is removed from the backside until the sacrificial material is exposed. Accordingly, in some embodiments, a portion of the one or more dielectric layers may also be removed along with the substrate in order to expose the sacrificial material. An isotropic etching process may be performed to remove the exposed sacrificial material thus leaving behind a trench extending along a length of one of the spacer structures and exposing an underside of the source or drain region coupled to the semiconductor material of the first fin.

Method 1700 continues with operation 1718 where a first conductive material is formed in the trench (e.g., replacing the sacrificial material) and a second trench is formed between the first conductive material and the gate structure over the semiconductor material of the second fin, according to some embodiments. The first conductive material contacts at least a portion of the source or drain region coupled to the semiconductor material of the first fin and can include any suitably conductive material, such as tungsten, copper, ruthenium, titanium, or any alloy thereof. Forming the second trench may include removing a portion of the one or more dielectric layers from the backside to expose at least a portion of the bottom surface of the gate structure gate structure over the semiconductor material of the second fin. The second trench may be formed via an anistropic etching process through the one or more dielectric layers. According to some embodiments, the second trench is formed directly adjacent to the first conductive material such that the first conductive material acts as a wall within the second trench.

Method 1700 continues with operation 1720 where a second conductive material is formed within the second trench, according to some embodiments. The second conductive material contacts at least a portion of both the gate structure over the semiconductor material of the second fin and the first conductive material. The second conductive material can include any suitably conductive material, such as tungsten, copper, ruthenium, titanium, or any alloy thereof. In some embodiments, the first conductive material and the second conductive material is the same conductive material. Together, the first conductive material and the second conductive material form a backside conductive structure that acts like a shunt contact between the source or drain region coupled to the semiconductor material of the first fin and the gate structure over the semiconductor material of the second fin.

Example System

Figure 18:
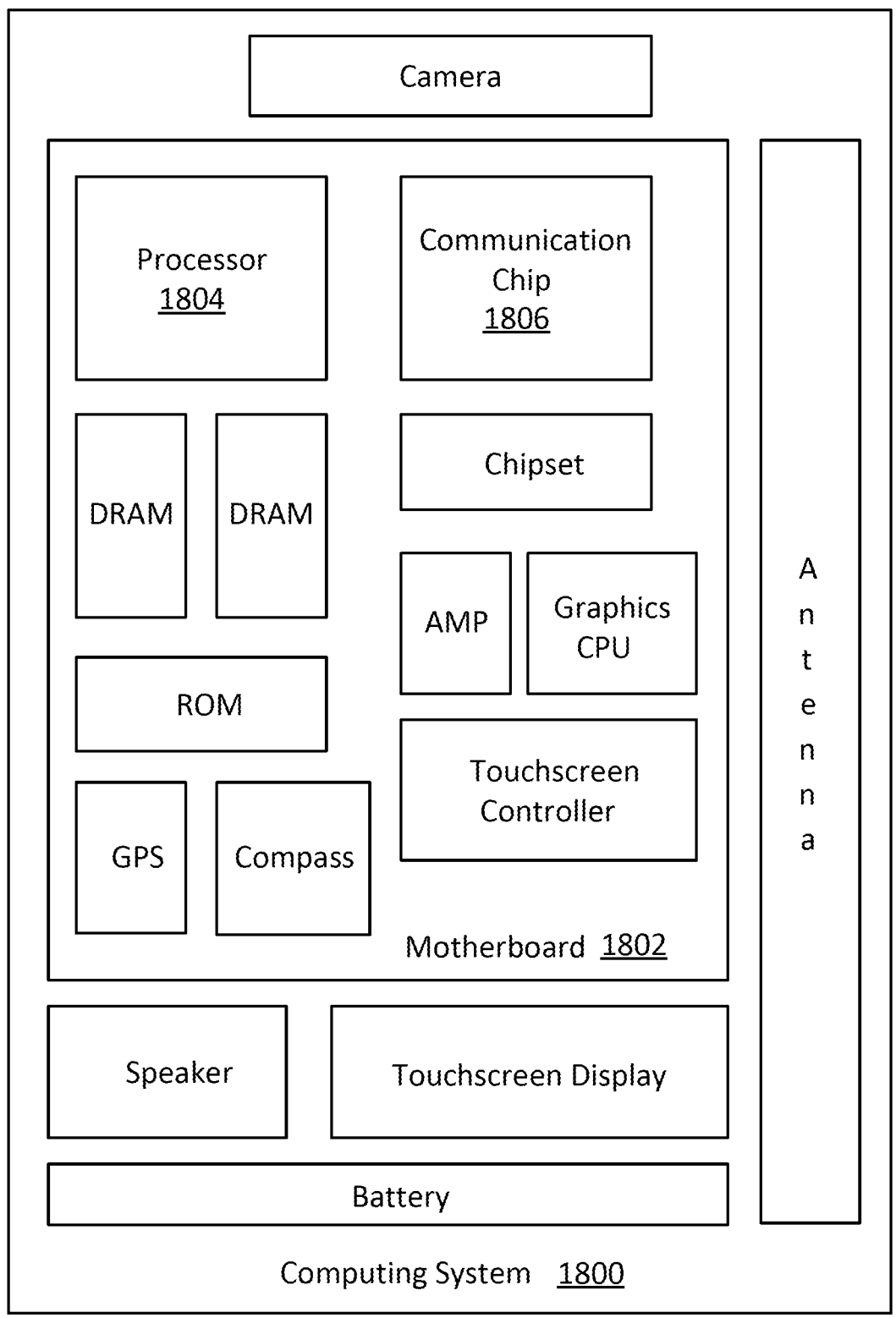
FIG. 18 illustrates a computing system including one or more integrated circuits, as variously described herein, in accordance with an embodiment of the present disclosure.

FIG. 18 is an example computing system implemented with one or more of the integrated circuit structures as disclosed herein, in accordance with some embodiments of the present disclosure. As can be seen, the computing system 1800 houses a motherboard 1802. The motherboard 1802 may include a number of components, including, but not limited to, a processor 1804 and at least one communication chip 1806, each of which can be physically and electrically coupled to the motherboard 1802, or otherwise integrated therein. As will be appreciated, the motherboard 1802 may be, for example, any printed circuit board (PCB), whether a main board, a daughterboard mounted on a main board, or the only board of system 1800, etc.

Depending on its applications, computing system 1800 may include one or more other components that may or may not be physically and electrically coupled to the motherboard 1802. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1800 may include one or more integrated circuit structures or devices configured in accordance with an example embodiment (e.g., a module including an integrated circuit device on a substrate, the substrate having one or more semiconductor devices with a conductive backside structure, as variously provided herein). In some embodiments, multiple functions can be integrated into one or more chips (e.g., for instance, note that the communication chip 1806 can be part of or otherwise integrated into the processor 1804).

The communication chip 1806 enables wireless communications for the transfer of data to and from the computing system 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1800 may include a plurality of communication chips 1806. For instance, a first communication chip 1806 may be dedicated to shorter range wireless communications such as Wi-Fi and Bluetooth and a second communication chip 1806 may be dedicated to longer range wireless communications such as GPS, EDGE, GPRS, CDMA, WiMAX, LTE, Ev-DO, and others.

The processor 1804 of the computing system 1800 includes an integrated circuit die packaged within the processor 1804. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1806 also may include an integrated circuit die packaged within the communication chip 1806. In accordance with some such example embodiments, the integrated circuit die of the communication chip includes one or more semiconductor devices as variously described herein. As will be appreciated in light of this disclosure, note that multi-standard wireless capability may be integrated directly into the processor 1804 (e.g., where functionality of any chips 1806 is integrated into processor 1804, rather than having separate communication chips). Further note that processor 1804 may be a chip set having such wireless capability. In short, any number of processor 1804 and/or communication chips 1806 can be used. Likewise, any one chip or chip set can have multiple functions integrated therein.

In various implementations, the computing system 1800 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1800 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device comprising first semiconductor material extending between a first source region and a first drain region, a second semiconductor device comprising second semiconductor material extending between a second source region and a second drain region, a first gate structure over the first semiconductor material, a second gate structure over the second semiconductor material, and a conductive backside structure that contacts the first source region or the first drain region of the first semiconductor device from underneath the first source region or the first drain region and contacts the second gate structure from underneath the second gate structure.

Example 2 includes the subject matter of Example 1, wherein the first semiconductor material comprises a first set of one or more semiconductor nanoribbons and the second semiconductor material comprises a second set of one or more semiconductor nanoribbons.

Example 3 includes the subject matter of Example 2, wherein the first set of semiconductor nanoribbons and the second set of semiconductor nanoribbons comprise germanium, silicon, or both.

Example 4 includes the subject matter of any one of Examples 1-3, wherein the first semiconductor material and the second semiconductor material both comprise n-type dopants.

Example 5 includes the subject matter of Example 4, comprising a third semiconductor device having a third semiconductor material comprising p-type dopants, and a fourth semiconductor device having a fourth semiconductor material comprising p-type dopants. The third semiconductor material is aligned above the first semiconductor material and the fourth semiconductor material is aligned above the second semiconductor material.

Example 6 includes the subject matter of Example 5, wherein the first, second, third, and fourth semiconductor devices are part of an SRAM unit cell.

Example 7 includes the subject matter of Example 5 or 6, wherein the conductive backside structure is a first conductive backside structure and the integrated circuit further includes a third gate structure over the third semiconductor material and a fourth gate structure over the fourth semiconductor material. The first conductive backside structure connects the second and fourth gate structures to the first source or drain region of the first semiconductor device and a second conductive backside structure connects the first and third gate structures to the second source or drain region of the second semiconductor device.

Example 8 includes the subject matter of Example 7, further comprising a fifth semiconductor device that shares a source or drain region with a source or drain region of the third semiconductor device, and a sixth semiconductor device that shares a source or drain region with a source or drain region of the fourth semiconductor device.

Example 9 includes the subject matter of Example 8, wherein a gate structure of the fifth semiconductor device and a gate structure of the sixth semiconductor device are coupled to a word line of a memory cell. A source or drain region of the fifth semiconductor device is coupled to a first bit line of the memory cell, and a source or drain region of the sixth semiconductor device is coupled to a second bit line of the memory cell.

Example 10 includes the subject matter of any one of Examples 1-9, wherein the conductive backside structure includes a first conductive layer extending lengthwise in a first direction and contacting the first source region or the first drain region of the first semiconductor device from underneath the first source region or the first drain region, and a second conductive layer intersecting the first conductive layer and contacting the second gate structure from underneath the second gate structure.

Example 11 includes the subject matter of Example 10, wherein the second conductive layer extends lengthwise in a second direction that is orthogonal to the first direction.

Example 12 includes the subject matter of Example 10 or 11, wherein the first conductive layer is aligned in the first direction along a spacer structure on a sidewall of the first gate structure.

Example 13 includes the subject matter of any one of Examples 1-12, wherein the first gate structure and the second gate structure each extends lengthwise in a same direction.

Example 14 includes the subject matter of any one of Examples 1-13, wherein the first gate structure and the second gate structure each extend lengthwise along a same plane, and the integrated circuit comprises a gate cut between the first gate structure and the second gate structure.

Example 15 is a printed circuit board comprising the integrated circuit of any one of Examples 1-14.

Example 16 is an electronic device that includes a chip package comprising one or more dies. At least one of the one or more dies includes a first semiconductor device comprising first semiconductor material extending between a first source region and a first drain region, a second semiconductor device comprising second semiconductor material extending between a second source region and a second drain region, a first gate structure over the first semiconductor material, a second gate structure over the second semiconductor material, and a conductive backside structure that contacts the first source region or the first drain region of the first semiconductor device from underneath the first source region or the first drain region and contacts the second gate structure from underneath the second gate structure.

Example 17 includes the subject matter of Example 16, wherein the first semiconductor material comprises a first plurality of semiconductor nanoribbons and the second semiconductor material comprises a second plurality of semiconductor nanoribbons.

Example 18 includes the subject matter of Example 17, wherein the first plurality of semiconductor nanoribbons and the second plurality of semiconductor nanoribbons comprise germanium, silicon, or both.

Example 19 includes the subject matter of any one of Examples 16-18, wherein the first semiconductor material and the second semiconductor material both comprise n-type dopants.

Example 20 includes the subject matter of Example 19, wherein the at least one of the one or more dies comprises a third semiconductor device having a third semiconductor material comprising p-type dopants and aligned above the first semiconductor material, and a fourth semiconductor device having a fourth semiconductor material comprising p-type dopants and aligned above the second semiconductor material.

Example 21 includes the subject matter of Example 20, wherein the first, second, third, and fourth semiconductor devices are part of an SRAM unit cell.

Example 22 includes the subject matter of any one of Examples 16-21, wherein the conductive backside structure includes a first conductive layer extending lengthwise in a first direction and contacting the first source region or the first drain region of the first semiconductor device from underneath the first source region or the first drain region, and a second conductive layer intersecting the first conductive layer and contacting the second gate structure from underneath the second gate structure.

Example 23 includes the subject matter of Example 22, wherein the second conductive layer extends lengthwise in a second direction that is orthogonal to the first direction.

Example 24 includes the subject matter of Example 22 or 23, wherein the first conductive layer is aligned in the first direction along a spacer structure on a sidewall of the first gate structure.

Example 25 includes the subject matter of any one of Examples 16-24, wherein the first gate structure and the second gate structure each extends lengthwise in a same direction.

Example 26 includes the subject matter of any one of Examples 16-25, wherein the first gate structure and the second gate structure each extend lengthwise along a same plane, and the one or more dies comprises a dielectric gate cut between the first gate structure and the second gate structure.

Example 27 includes the subject matter of any one of Examples 16-26, comprising a printed circuit board, wherein the chip package is attached to the printed circuit board.

Example 28 is an integrated circuit that includes a first semiconductor device comprising one or more first semiconductor nanoribbons extending between a first source region and a first drain region, a second semiconductor device comprising one or more second semiconductor nanoribbons extending between a second source region and a second drain region, a first gate structure over the one or more first semiconductor nanoribbons, a second gate structure over the one or more second semiconductor nanoribbons, a first conductive layer extending lengthwise in a first direction and contacting the first source region or the first drain region of the first semiconductor device from underneath the first source region or the first drain region, and a second conductive layer intersecting the first conductive layer and contacting the second gate structure from underneath the second gate structure.

Example 29 includes the subject matter of Example 28, wherein the second conductive layer extends lengthwise in a second direction that is orthogonal to the first direction.

Example 30 is a method of forming an integrated circuit. The method includes forming a first fin having first semiconductor material on a semiconductor substrate and a second fin having second semiconductor material on the semiconductor substrate; forming a dielectric layer at least between the first fin and the second fin and on the semiconductor substrate; forming a sacrificial gate layer over at least the first fin; forming a spacer structure on a sidewall of the sacrificial gate layer; etching a first trench through a portion of the dielectric layer and adjacent to the spacer structure; forming a sacrificial layer in the first trench; forming a source or drain region coupled to the first semiconductor material and over the sacrificial layer; forming a gate structure having a gate electrode and a gate dielectric over at least the second semiconductor material; removing the substrate; removing the sacrificial layer from the first trench and forming a first conductive layer in the first trench; etching a second trench through a portion of the dielectric layer between the first conductive layer and the gate structure; and forming a second conductive layer in the second trench.

Example 31 includes the subject matter of Example 30, wherein the sacrificial layer comprises titanium and nitrogen.

Example 32 includes the subject matter of Example 30 or 31, wherein the first conductive layer is aligned lengthwise in a first direction along the spacer structure and the second conductive layer is aligned lengthwise in a second direction different from the first direction.

Example 33 includes the subject matter of Example 32, wherein the first direction is orthogonal to the second direction.

Example 34 includes the subject matter of any one of Examples 30-33, comprising forming one or more first nanoribbons from the first semiconductor material and one or more second nanoribbons from the second semiconductor material.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
    a first semiconductor device comprising first semiconductor material extending between a first source region and a first drain region;
    a second semiconductor device comprising second semiconductor material extending between a second source region and a second drain region;
    a first gate structure over the first semiconductor material;
    a second gate structure over the second semiconductor material;
    a dielectric layer beneath the first gate structure and the second gate structure; and
    a conductive backside structure having a first conductive layer that extends along a plane of the dielectric layer and contacts the first source region or the first drain region of the first semiconductor device from underneath the first source region or the first drain region and having a second conductive layer that extends along the plane of the dielectric layer and intersects the first conductive layer within the plane of the dielectric layer and contacts the second gate structure from underneath the second gate structure.

2. The integrated circuit of claim 1, wherein the first semiconductor material comprises a first set of one or more semiconductor nanoribbons and the second semiconductor material comprises a second set of one or more semiconductor nanoribbons.

3. The integrated circuit of claim 1, wherein the first semiconductor material and the second semiconductor material both comprise n-type dopants.

4. The integrated circuit of claim 3, comprising:
a third semiconductor device having a third semiconductor material comprising p-type dopants and aligned above the first semiconductor material; and
a fourth semiconductor device having a fourth semiconductor material comprising p-type dopants and aligned above the second semiconductor material.

5. The integrated circuit of claim 4, wherein the first, second, third, and fourth semiconductor devices are part of an SRAM unit cell.

6. The integrated circuit of claim 1, wherein the first conductive layer extends lengthwise in a first direction along the plane and the second conductive layer extends lengthwise in a second direction, orthogonal to the first direction, along the plane.

7. The integrated circuit of claim 6, wherein the first conductive layer is aligned in the first direction along a spacer structure on a sidewall of both the first gate structure and the second gate structure.

8. The integrated circuit of claim 1, wherein the first gate structure and the second gate structure each extend lengthwise along a same plane, and the integrated circuit comprises a gate cut between the first gate structure and the second gate structure.

9. A die comprising the integrated circuit of claim 1.

10. An electronic device, comprising:
a chip package comprising one or more dies, at least one of the one or more dies comprising
a first semiconductor device comprising first semiconductor material extending between a first source region and a first drain region;
a second semiconductor device comprising second semiconductor material extending between a second source region and a second drain region;
a first gate structure over the first semiconductor material;
a second gate structure over the second semiconductor material;
a dielectric layer beneath the first gate structure and the second gate structure; and
a conductive backside structure having a first conductive layer that extends along a plane of the dielectric layer and contacts the first source region or the first drain region of the first semiconductor device from underneath the first source region or the first drain region and having a second conductive layer that extends along the plane of the dielectric layer and intersects the first conductive layer within the plane of the dielectric layer and contacts the second gate structure from underneath the second gate structure.

11. The electronic device of claim 10, wherein the first semiconductor material comprises a first plurality of semiconductor nanoribbons and the second semiconductor material comprises a second plurality of semiconductor nanoribbons.

12. The electronic device of claim 10, wherein the first semiconductor material and the second semiconductor material both comprise n-type dopants.

13. The electronic device of claim 12, wherein the at least one of the one or more dies comprises:
a third semiconductor device having a third semiconductor material comprising p-type dopants and aligned above the first semiconductor material, and
a fourth semiconductor device having a fourth semiconductor material comprising p-type dopants and aligned above the second semiconductor material.

14. The electronic device of claim 10, wherein the first conductive layer extends lengthwise in a first direction along the plane and the second conductive layer extends lengthwise in a second direction, orthogonal to the first direction, along the plane.

15. The electronic device of claim 14, wherein the first conductive layer is aligned in the first direction along a spacer structure on a sidewall of both the first gate structure and the second gate structure.

16. The electronic device of claim 10, wherein the first gate structure and the second gate structure each extend lengthwise along a same plane, and the one or more dies comprises a dielectric gate cut between the first gate structure and the second gate structure.

17. The electronic device of claim 10, comprising a printed circuit board, wherein the chip package is attached to the printed circuit board.

18. An integrated circuit comprising:
a first semiconductor device comprising one or more first semiconductor nanoribbons extending between a first source region and a first drain region;
a second semiconductor device comprising one or more second semiconductor nanoribbons extending between a second source region and a second drain region;
a first gate structure over the one or more first semiconductor nanoribbons;
a second gate structure over the one or more second semiconductor nanoribbons;
a dielectric layer beneath the first gate structure and the second gate structure;
a first conductive layer extending lengthwise along a plane of the dielectric layer in a first direction and contacting the first source region or the first drain region of the first semiconductor device from underneath the first source region or the first drain region; and
a second conductive layer intersecting the first conductive layer within the plane of the dielectric layer and contacting the second gate structure from underneath the second gate structure.

19. The integrated circuit of claim 18, wherein the second conductive layer extends lengthwise along the plane of the dielectric layer in a second direction that is orthogonal to the first direction.

20. The integrated circuit of claim 18, wherein the first conductive layer is aligned in the first direction along a spacer structure on a sidewall of both the first gate structure and the second gate structure.

* * * * *